United States Patent
Gunnam et al.

(10) Patent No.: US 8,607,115 B2
(45) Date of Patent: Dec. 10, 2013

(54) ERROR-CORRECTION DECODER EMPLOYING CHECK-NODE MESSAGE AVERAGING

(75) Inventors: Kiran Gunnam, San Jose, CA (US); Shaohua Yang, San Jose, CA (US); Changyou Xu, Fremont, CA (US)

(73) Assignee: LSI Corporation, San Jose, CA (US)

( * ) Notice: Subject to any disclaimer, the term of this patent is extended or adjusted under 35 U.S.C. 154(b) by 971 days.

(21) Appl. No.: 12/475,786

(22) Filed: Jun. 1, 2009

(65) Prior Publication Data
US 2010/0042891 A1 Feb. 18, 2010

Related U.S. Application Data

(60) Provisional application No. 61/089,297, filed on Aug. 15, 2008.

(51) Int. Cl.
*H03M 13/00* (2006.01)
(52) U.S. Cl.
USPC .......................................................... 714/752
(58) Field of Classification Search
USPC .......................................................... 714/752
See application file for complete search history.

(56) References Cited

U.S. PATENT DOCUMENTS

| | | |
|---|---|---|
| 3,755,779 A | 8/1973 | Price |
| 4,295,218 A | 10/1981 | Tanner |
| 5,048,060 A | 9/1991 | Arai et al. |
| 6,236,686 B1 | 5/2001 | Kamishima |
| 6,307,901 B1 | 10/2001 | Yu et al. |
| 6,550,023 B1 | 4/2003 | Brauch et al. |
| 6,745,157 B1 * | 6/2004 | Weiss et al. .................. 703/2 |

(Continued)

FOREIGN PATENT DOCUMENTS

| | | |
|---|---|---|
| CN | 101174838 A | 5/2008 |
| CN | 101174839 A | 5/2008 |

(Continued)

OTHER PUBLICATIONS

Vila Casado, Andres I., Weng, Wen-Yen and Wesel, Richard D. "Multiple Rate Low-Density Parity-Check Codes with Constant Blocklength," IEEE 2004, pp. 2010-2014.

(Continued)

*Primary Examiner* — Albert Decady
*Assistant Examiner* — Enam Ahmed
(74) *Attorney, Agent, or Firm* — Mendelsohn, Drucker & Dunleavy, P.C.; Craig M. Brown; Steve Mendelsohn

(57) ABSTRACT

In one embodiment, an LDPC decoder has a controller and one or more check-node units (CNUs). Each CNU is selectively configurable to operate in (i) a first mode that updates check-node (i.e., R) messages without averaging and (ii) a second mode that that updates R messages using averaging. Initially, each CNU is configured in the first mode to generate non-averaged R messages, and the decoder attempts to recover an LDPC-encoded codeword using the non-averaged R messages. If the decoder is unable to recover the correct codeword, then (i) the controller selects the averaging mode, (ii) each CNU is configured to operate in the second mode to generate averaged R messages, and (iii) the decoder attempts to recover the correct codeword using the averaged R messages. Averaging the R messages may slow down the propagation of erroneous messages that lead the decoder to convergence on trapping sets.

19 Claims, 8 Drawing Sheets

(56) References Cited

U.S. PATENT DOCUMENTS

| | | | |
|---|---|---|---|
| 6,888,897 B1 | 5/2005 | Nazari et al. | |
| 6,910,000 B1 * | 6/2005 | Yedidia et al. | 703/2 |
| 7,143,333 B2 | 11/2006 | Blankenship et al. | |
| 7,181,676 B2 | 2/2007 | Hocevar | |
| 7,219,288 B2 | 5/2007 | Dielissen et al. | |
| 7,237,181 B2 | 6/2007 | Richardson | |
| 7,296,216 B2 | 11/2007 | Shen et al. | |
| 7,340,671 B2 | 3/2008 | Jones et al. | |
| 7,353,444 B2 | 4/2008 | Owsley et al. | |
| 7,373,581 B2 * | 5/2008 | Okamura et al. | 714/752 |
| 7,457,367 B2 | 11/2008 | Farhang-Boroujeny et al. | |
| 7,689,888 B2 | 3/2010 | Kan et al. | |
| 7,725,800 B2 | 5/2010 | Yang et al. | |
| 7,739,558 B1 | 6/2010 | Farjadrad et al. | |
| 7,752,523 B1 | 7/2010 | Chaichanavong et al. | |
| 7,770,090 B1 | 8/2010 | Kons et al. | |
| 7,805,642 B1 | 9/2010 | Farjadrad | |
| 7,809,089 B2 | 10/2010 | Kuroyanagi et al. | |
| 7,895,500 B2 | 2/2011 | Sun et al. | |
| 7,904,793 B2 | 3/2011 | Mokhlesi et al. | |
| 7,941,737 B2 | 5/2011 | Gopalakrishnan et al. | |
| 7,949,927 B2 | 5/2011 | Park et al. | |
| 8,010,869 B2 | 8/2011 | Wejn et al. | |
| 8,020,070 B2 | 9/2011 | Langner et al. | |
| 8,037,394 B2 | 10/2011 | Djurdjevic et al. | |
| 8,046,658 B2 | 10/2011 | Heinrich et al. | |
| 8,051,363 B1 | 11/2011 | Liu | |
| 8,103,931 B2 | 1/2012 | Wang et al. | |
| 8,127,209 B1 | 2/2012 | Zhang et al. | |
| 8,151,171 B2 | 4/2012 | Blanksby | |
| 8,156,409 B2 | 4/2012 | Patapoutian et al. | |
| 8,161,345 B2 | 4/2012 | Graef | |
| 8,171,367 B2 | 5/2012 | Gao et al. | |
| 8,205,134 B2 | 6/2012 | Harrison et al. | |
| 8,205,144 B1 | 6/2012 | Yadav | |
| 8,214,719 B1 | 7/2012 | Sheng et al. | |
| 8,219,878 B1 | 7/2012 | Varnica et al. | |
| 8,255,763 B1 | 8/2012 | Yang et al. | |
| 8,301,984 B1 | 10/2012 | Zhang et al. | |
| 2002/0062468 A1 | 5/2002 | Nagase et al. | |
| 2002/0166095 A1 | 11/2002 | Lavi et al. | |
| 2005/0132260 A1 * | 6/2005 | Kyung et al. | 714/752 |
| 2005/0193320 A1 | 9/2005 | Varnica et al. | |
| 2005/0204255 A1 | 9/2005 | Yeh et al. | |
| 2005/0204264 A1 | 9/2005 | Yusa | |
| 2005/0283707 A1 | 12/2005 | Sharon et al. | |
| 2006/0036928 A1 | 2/2006 | Eroz et al. | |
| 2006/0107181 A1 | 5/2006 | Dave et al. | |
| 2006/0115802 A1 | 6/2006 | Reynolds | |
| 2006/0285852 A1 | 12/2006 | Xi et al. | |
| 2007/0011569 A1 | 1/2007 | Vila Casado et al. | |
| 2007/0011573 A1 | 1/2007 | Farjadrad et al. | |
| 2007/0011586 A1 | 1/2007 | Belogolovyi et al. | |
| 2007/0044006 A1 | 2/2007 | Yang et al. | |
| 2007/0071009 A1 | 3/2007 | Nagaraj et al. | |
| 2007/0089018 A1 | 4/2007 | Tang et al. | |
| 2007/0089019 A1 | 4/2007 | Tang et al. | |
| 2007/0124652 A1 | 5/2007 | Litsyn et al. | |
| 2007/0147481 A1 | 6/2007 | Bottomley et al. | |
| 2007/0153943 A1 | 7/2007 | Nissila | |
| 2007/0162788 A1 | 7/2007 | Moelker | |
| 2007/0220408 A1 | 9/2007 | Huggett et al. | |
| 2007/0234178 A1 | 10/2007 | Richardson et al. | |
| 2007/0234184 A1 | 10/2007 | Richardson | |
| 2008/0049869 A1 | 2/2008 | Heinrich et al. | |
| 2008/0082868 A1 | 4/2008 | Tran et al. | |
| 2008/0104485 A1 | 5/2008 | Lyakh et al. | |
| 2008/0109701 A1 | 5/2008 | Yu et al. | |
| 2008/0126910 A1 | 5/2008 | Venkatesan et al. | |
| 2008/0148129 A1 | 6/2008 | Moon | |
| 2008/0163032 A1 | 7/2008 | Lastra-Montano | |
| 2008/0235561 A1 | 9/2008 | Yang | |
| 2008/0276156 A1 | 11/2008 | Gunnam et al. | |
| 2008/0301517 A1 | 12/2008 | Zhong | |
| 2008/0301521 A1 | 12/2008 | Gunnam et al. | |
| 2009/0019338 A1 | 1/2009 | Obuchi et al. | |
| 2009/0063931 A1 | 3/2009 | Rovini et al. | |
| 2009/0083609 A1 | 3/2009 | Yue et al. | |
| 2009/0132897 A1 | 5/2009 | Xu et al. | |
| 2009/0150745 A1 | 6/2009 | Langner et al. | |
| 2009/0235146 A1 | 9/2009 | Tan et al. | |
| 2009/0259912 A1 | 10/2009 | Djordjevic et al. | |
| 2009/0273492 A1 | 11/2009 | Yang et al. | |
| 2009/0307566 A1 | 12/2009 | No et al. | |
| 2009/0319860 A1 | 12/2009 | Sharon et al. | |
| 2010/0037121 A1 | 2/2010 | Jin et al. | |
| 2010/0042806 A1 | 2/2010 | Gunnam | |
| 2010/0042890 A1 | 2/2010 | Gunnam | |
| 2010/0050043 A1 | 2/2010 | Savin | |
| 2010/0058152 A1 | 3/2010 | Harada | |
| 2010/0088575 A1 | 4/2010 | Sharon et al. | |
| 2011/0041029 A1 | 2/2011 | Yedidia et al. | |
| 2012/0135285 A1 | 5/2012 | Iwama et al. | |
| 2012/0139074 A1 | 6/2012 | Abe | |

FOREIGN PATENT DOCUMENTS

| | | |
|---|---|---|
| EP | 1926142 A1 | 5/2008 |
| JP | 2001251384 A | 9/2001 |
| JP | 2004005854 A | 1/2004 |
| JP | 2005020505 A | 1/2005 |
| JP | 2005500513 A | 1/2005 |
| JP | 2007036495 A | 11/2007 |
| JP | 2008112516 A | 5/2008 |
| JP | 200910222 A | 5/2009 |
| WO | WO03092170 A1 | 11/2003 |
| WO | WO2004079563 A1 | 9/2004 |
| WO | WO2007114724 A1 | 10/2007 |
| WO | WO2008004215 A2 | 1/2008 |
| WO | WO 2010/019168 A1 | 2/2010 |

OTHER PUBLICATIONS

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

Cavus et el., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp, 2386-2390.

Cavus, Enver et al., "An IS Simulation Technique, for Very Low BER Performance Evaluation of LDPC Codes," IEEE International Conference on Communications, Jun. 1, 2006, pp. 1095-1100.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Richardson, Tom, "Error Floors of LDPC Codes," Allerton Conf. on Communication, Control and Computing, (Monticello, Illinois), Oct. 2003, pp. 1426-1435.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Sripimanwat, K., "Turbo Code Applications: A Journey From a Paper to Realization", Oct. 26, 2005, Springer, p. 27.

K. Gunnam et al., "Value Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

(56) References Cited

OTHER PUBLICATIONS

K. Gunnam "Area and Energy Efficient VLSI Architectures for Low-Density Parity-Check Decoders Using an On-The-Fly Computation" dissertation at Texas A&M University, Dec. 2006.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. 15.

Stefan Landner, Olgica Milenkovic—"Algorithmic and Combinational Analysis of Trapping Sets in Structured LDPC Codes", International Conference on Wireless Networks, Communications and Mobile Computing, 2005, pp. 630-635, vol. 1.

Hao Zhong, Tong Zhang—"Block—LDPC: A Practical LDPC Coding System Design Approach", IEEE tranactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. MacKay—"Information Theory, Inference, and Learning Algorithms", Cambridge University Press Sep. 2003, p. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, In Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002, ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,p. 90.

T. Richardson and R. Urbanke—"Modern Coding Theory", Cambridge University Press, Preliminary version—Oct. 18, 2007, p. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers. 2008, pp. 1148-1152.

D.J.C. MacKay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007 pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes". 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transactions on Information Theory, Sep. 1981,pp. 533-547, vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.

Alghonaim, E., et al., "Improving BER Performance of LDPC codes Based on Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.

Pusane, A.E.; Costello, D.J.; Mitchell, D.G.M;, "Trapping Set Analysis of Protograph-Based LDPC Convolutional Codes," Information Theory, 2009. ISIT 2009. IEEE International Symposium on, Vol., No., pp. 561-565, Jun. 28, 2009-Jul. 3, 2009.

Laendner, S.; Milenkovic, O.;, "LDPC Codes Based on Latin Squares: Cycle Structure, Stopping Set, and Trapping Set Analysis," Communications, IEEE Transactions on, vol. 55, No. 2, pp. 303-312, Feb. 2007.

Dehkordi, M.K,; Banihashemi, A.H.;, "An Efficient Algorithm for Finding Dominant Trapping Sets of LDPC Codes," Turbo Codes and Iterative Information Processing (ISTC), 2010 6th International Symposium on pp. 444-448, Sep. 6-10, 2010.

C. A. Cole, S. G. Wilson, E. K. Hall and T. R. Giallorenzi, "A General Method for Finding Low Error Rates of LDPC Codes," http://arxviv.org/abs/cs.IT/0605051.

D. MacKay and M. Postol, "Weaknesses of margulis and ramanujan-margulis low- density parity-check codes," Electronic Notes in Theoretical Computer Science, vol. 74, 2003.

B. Xia and W. E. Ryan, "On importance sampling for linear block codes," Proc. 2003 IEEE International Conference on Communications, vol. 4, pp. 2904-2908, May 2003.

L. Dolecek, Z. Zhang, M. Wainwright, V. Anantharam, and B. Nikoli'c, "Evaluation of the low frame error rate performance of

(56) References Cited

OTHER PUBLICATIONS

LDPC codes using importance sampling," 2007 IEEE Inform. Theory Workshop, Sep. 2-6, 2007.

Casado, V., el al., "Informed Dynamic Scheduling for Belief-Propagation Decoding of LDPC Codes," IEEE International Conference on Communications, Jun. 24-28, 2007, pp. 932-937.

Presman, N., et al., "Efficient Layers-based Schedules for Iterative Decoding of LDPC Codes," IEEE International Symposium on Information Theory, Jul. 6-11, 2008, pp. 1148-1152.

Radosavljevic. P., et al., "Optimized Message Passing Schedules for LDPC Decoding," Conference Record of the Thirty-Ninth Asilomar conference on Signals, Systems and Computers. Oct. 28, 2005-Nov. 1, 2005, pp. 591-595.

Zheng, H., et al., "MMSE-Based Design of Scaled and Offset BP-Based Decoding Algorithms on the Fast Rayleigh Fading Channel," IEEE International Symposium on Circuits and Systems, May 24, 2006, pp. 2061-2064.

Sakai, R., et al., "Reduced Complexity Decoding Based on Approximation of Update Function or Low-Density Parity-Check Codes," Tranactions of the Institute of Electronics, Information and Communication Engineers, Feb. 1, 2007, vol. J90-A, No. 2, pp. 83-91.

Koetter, R., et al. "Turbo equalization," Signal Processing Magazine, IEEE , vol. 21, No. 1, pp. 67-80, Jan. 2004.

Cavus, E., et al., "Low BER performance estimation of LDPC codes via application of importance sampling to trapping sets," IEEE Transactions on Communications, vol. 57, No. 7, pp. 1886-1888, Jul. 2009.

Ryan, W. E., et al., "Channel Codes: Classical and Modern," Cambridge University Press, 2009, 710 pages.

Matsuoka, K., et al., "improvement of Turbo Equalization with LDPC Code,"IEICE Transaction, Apr. 1, 2007, vol. J90-B, No. 4, pp. 432-436 with partial English translation.

Lee, M.K., et al., "Adaptive Turbo Equalizer with Stopping Rule Based on LDPC Codes," ISIT, 2009, pp. 928-932.

\* cited by examiner $$H = \begin{pmatrix} B_{1,1} & B_{1,2} & B_{1,3} & B_{1,4} & B_{1,5} & B_{1,6} & B_{1,7} & B_{1,8} & B_{1,9} & B_{1,10} \\ B_{2,1} & B_{2,2} & B_{2,3} & B_{2,4} & B_{2,5} & B_{2,6} & B_{2,7} & B_{2,8} & B_{2,9} & B_{2,10} \\ B_{3,1} & B_{3,2} & B_{3,3} & B_{3,4} & B_{3,5} & B_{3,6} & B_{3,7} & B_{3,8} & B_{3,9} & B_{3,10} \\ B_{4,1} & B_{4,2} & B_{4,3} & B_{4,4} & B_{4,5} & B_{4,6} & B_{4,7} & B_{4,8} & B_{4,9} & B_{4,10} \end{pmatrix} \begin{matrix} \} r = 4 \end{matrix}$$

ERROR-CORRECTION DECODER EMPLOYING CHECK-NODE MESSAGE AVERAGING

CROSS-REFERENCE TO RELATED APPLICATIONS

This application claims the benefit of the filing date of U.S. provisional application No. 61/089,297, filed on Aug. 15, 2008, the teachings all of which are incorporated herein by reference in their entirety.

The subject matter of this application is related to U.S. patent application Ser. No. 12/113,729 filed May 1, 2008, U.S. patent application Ser. No. 12/113,755 filed May 1, 2008, U.S. patent application Ser. No. 12/323,626 filed Nov. 26, 2008, U.S. patent application Ser. No. 12/401,116 filed Mar. 10, 2009, PCT patent application no. PCT/US08/86523 filed Dec. 12, 2008, PCT patent application no. PCT/US08/86537 filed Dec. 12, 2008, PCT patent application no. PCT/US09/39279 filed Apr. 2, 2009, PCT patent application no. PCT/US09/39918 filed Apr. 8, 2009, and U.S. patent application Ser. No. 12/420,535 filed Apr. 8, 2009, the teachings all of which are incorporated herein by reference in their entirety.

BACKGROUND OF THE INVENTION

1. Field of the Invention

The present invention relates to signal processing, and, in particular, to error-correction encoding and decoding techniques such as low-density parity-check (LDPC) encoding and decoding.

2. Description of the Related Art

In attempting to recover a correct low-density parity-check (LDPC)-encoded codeword, an LDPC decoder may encounter one or more trapping sets that prevent the decoder from properly decoding the codeword. Trapping sets, which represent subgraphs in a Tanner graph of an LDPC code, typically have a strong influence on error-floor characteristics of the LDPC code because a trapping set may force the decoder to converge to an incorrect result. To improve error-floor characteristics, an LDPC decoder may employ different techniques to, for example, (i) break dominant trapping sets (i.e., trapping sets typically having the most-significant influence on error-floor characteristics) and/or (ii) prevent the LDPC decoder from converging on such trapping sets.

SUMMARY OF THE INVENTION

In one embodiment, the present invention is an apparatus comprising an error-correction (EC) decoder for recovering an EC-encoded codeword. The EC decoder comprises a check-node unit (CNU) that receives a set of current input values, wherein the set of current input values corresponds to the EC-encoded codeword, and each current input value in the set corresponds to a different bit of the EC-encoded codeword. The CNU generates (i) a set of current check-node messages based on the set of current input values and (ii) a set of average check-node messages based on the set of current check-node messages and at least one set of previous check-node messages. Each average check-node message is generated by averaging a current check-node message and a corresponding previous check-node message for each set of the at least one set of previous check-node messages.

In another embodiment, the present invention is a method for recovering an EC-encoded codeword. The method receives a set of current input values, wherein the set of current input values corresponds to the EC-encoded codeword, and each current input value in the set corresponds to a different bit of the EC-encoded codeword. A set of current check-node messages is generated based on the set of current input values, and a set of average check-node messages is generated based on the set of current check-node messages and at least one set of previous check-node messages. Each average check-node message is generated by averaging a current check-node message and a corresponding previous check-node message for each set of the at least one set of previous check-node messages.

In yet another embodiment, the present invention is an apparatus comprising an EC decoder for recovering an EC-encoded codeword. The EC decoder comprises CNUs and variable-node units (VNUs) adapted to perform a message-passing algorithm. The CNUs are adapted to generate average check-node messages for transmission to the VNUs, and each average check-node message is generated by averaging (i) a current check-node message based on a set of current variable-node messages and (ii) at least one previous check-node message based on at least one set of previous variable-node messages.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 1 shows one implementation of a parity-check H-matrix that may be used to implement a regular, quasi-cyclic (QC) low-density parity-check (LDPC) code;

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

FIG. 1 shows one implementation of a parity-check matrix 100 that may be used to implement a regular, quasi-cyclic (QC) LDPC code. Parity-check matrix 100, commonly referred to as an H-matrix, comprises 40 circulants $B_{j,k}$ that are arranged in r=4 rows of circulants (i.e., block rows) where j=1, . . . , r and c=10 columns of circulants (i.e., block columns) where k=1, . . . , c. A circulant is a sub-matrix that is either an identity matrix or is obtained by cyclically shifting an identity matrix, and a quasi-cyclic LDPC code is an LDPC code in which all of the sub-matrices are circulants. In H-matrix 100, each circulant $B_{j,k}$ is a p×p sub-matrix that may be obtained by cyclically shifting a single p×p identity matrix. For purposes of this discussion, assume that p=72 such that H-matrix 100 has p×r=72×4=288 total rows and p×c=72× 10=720 total columns. Since each circulant $B_{j,k}$ is a permutation of an identity matrix, the hamming weight (i.e., the number of entries having a value of one) of each column in a circulant and the hamming weight of each row in a circulant are both equal to 1. Thus, the total hamming weight $w_r$ for each row of H-matrix 100 is equal to 1×c=1×10=10, and the total hamming weight $w_c$ for each column of H-matrix 100 is equal to 1×r=1×4=4. Each of the 288 rows of H-matrix 100 corresponds to an $m^{th}$ check node, where m ranges from 0, . . . , 287, and each of the 720 columns corresponds to an $n^{th}$ variable node (also referred to as a bit node), where n ranges from 0, . . . , 719. Further, each check node is connected to $w_r$=10 variable nodes as indicated by the 1s in a row, and each variable node is connected to $w_c$=4 check nodes as indicated by the 1s in a column. H-matrix 100 may be described as a regular LDPC code since all rows of H-matrix 100 have the same hamming weight $w_r$ and all columns of H-matrix 100 have the same hamming weight $w_c$.

Figure 2:
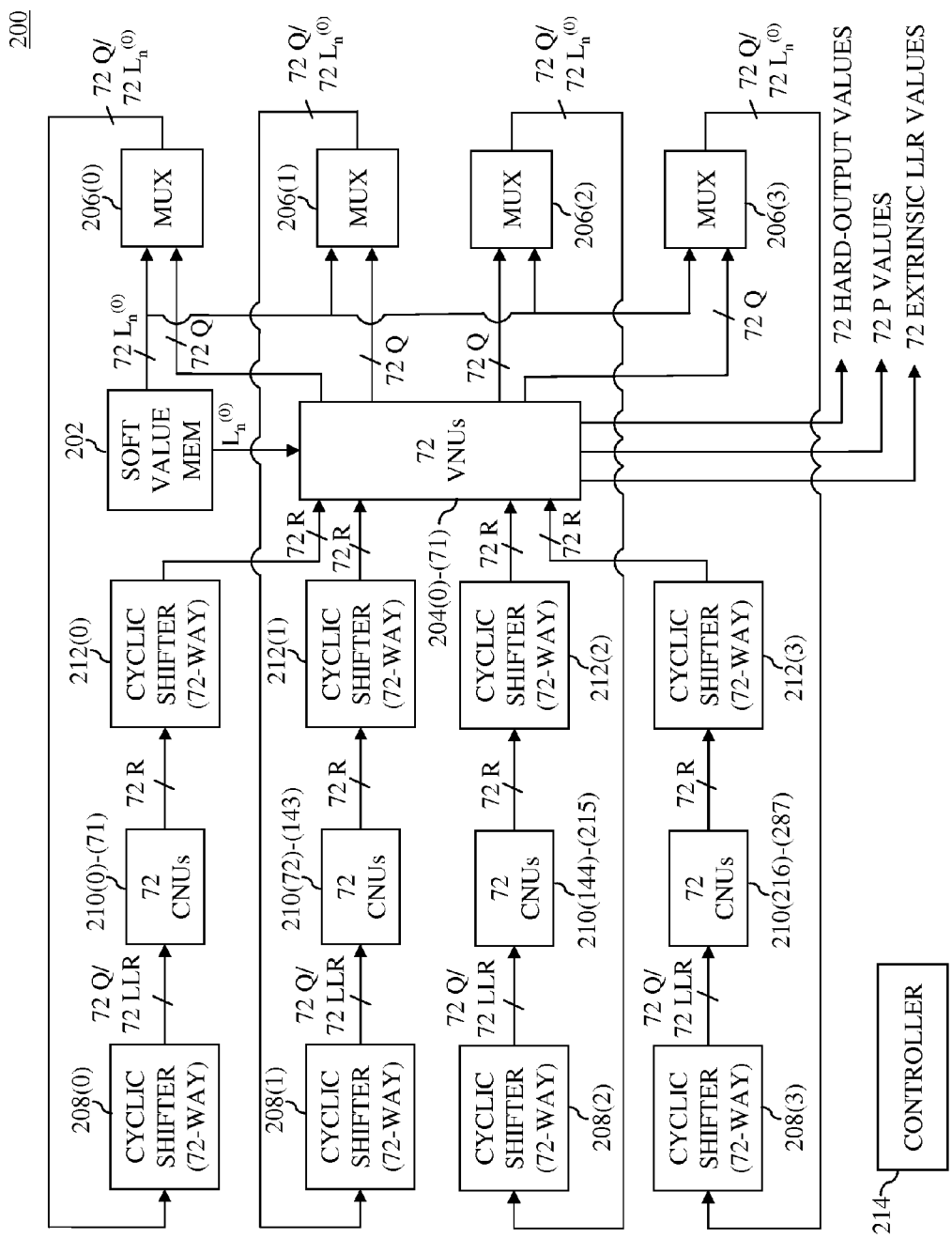
FIG. 2 shows a simplified block diagram of one implementation of an LDPC decoder that may be used to recover codewords encoded using an H-matrix such as the H-matrix of FIG. 1.

FIG. 2 shows a simplified block diagram of one implementation of a non-layered LDPC decoder 200 that may be used to recover codewords encoded using an H-matrix such as H-matrix 100 of FIG. 1. For each codeword to be recovered, LDPC decoder 200 (i) receives 720 soft values (e.g., log-likelihood ratios (LLR)) $L_n^{(0)}$ from an upstream processor that may perform, for example, radio-frequency processing, analog-to-digital conversion, equalization, channel detection such as Viterbi detection, or other processing suitable for generating soft-output values, and (ii) stores these soft values $L_n^{(0)}$ in soft-value memory 202. The processing performed by the upstream processor may depend on the particular application in which LDPC decoder 200 is implemented. Each soft value $L_n^{(0)}$ corresponds to one bit of the codeword, and each codeword is decoded iteratively using a message-passing algorithm. For this discussion, suppose that each soft value $L_n^{(0)}$ has five bits, including one hard-decision bit and a four-bit confidence value.

In general, LDPC decoder 200 decodes the 720 soft values $L_n^{(0)}$ (i.e., messages) using a block-serial message-passing schedule. The messages are updated using (i) 288 check-node units (CNUs) 210, where each CNU 210 performs check-node updates for one row (i.e., the $m^{th}$ check node) of H-matrix 100 and (ii) 72 five-bit variable-node units (VNUs) 204, where each VNU 204 performs the variable-node updates for ten columns (i.e., the $n^{th}$ variable nodes) of H-matrix 100. CNUs 210(0), . . . , 210(287) perform the check-node (i.e., row) updates for the 288 rows of H-matrix 100, one block column at a time, such that the check-node updates for the first block column (i.e., circulants $B_{1,1}$, $B_{2,1}$, $B_{3,1}$, and $B_{4,1}$) are performed, followed by the check-node updates for the second block column (i.e., circulants $B_{1,2}$, $B_{2,2}$, $B_{3,2}$, and $B_{4,2}$), followed by the check-node updates for the third block column (i.e., circulants $B_{1,3}$, $B_{2,3}$, $B_{3,3}$, and $B_{4,3}$), and so forth. VNUs 204(0), . . . , 204(71) then perform the variable-node (i.e., column) updates for the 720 columns of H-matrix 100, one block column at a time, such that the variable-node updates for the first block column (i.e., circulants $B_{1,1}$, $B_{2,1}$, $B_{3,1}$, and $B_{4,1}$) are performed, followed by the variable-node updates for the second block column (i.e., circulants $B_{1,2}$, $B_{2,2}$, $B_{3,2}$, and $B_{4,2}$), followed by the variable-node updates for the third block column (i.e., circulants $B_{1,3}$, $B_{2,3}$, $B_{3,3}$, and $B_{4,3}$), and so forth. An iteration of LDPC decoder 200 (i.e., a local iteration) is complete after all check-node updates and variable-node updates have been performed.

Initially, the 720 five-bit soft values $L_n^{(0)}$ are provided to four multiplexers 206(0), . . . , 206(3) at a rate of 72 soft values $L_n^{(0)}$ per clock cycle such that each multiplexer 206 receives all 72 soft values $L_n^{(0)}$ in the set. Each multiplexer 206 also receives 72 five-bit variable-node messages (herein referred to as Q messages) from VNUs 204(0), . . . , 204(71), which are generated as discussed in further detail below. During the first iteration of LDPC decoder 200, multiplexers 206(0), . . . , 206(3) select the sets of 72 five-bit soft values $L_n^{(0)}$ that they receive to output to 72-way cyclic shifters 208(0), . . . , 208(3), respectively. The initial Q messages, which are not selected, may be Q messages generated for a previously considered codeword. During subsequent iterations of LDPC decoder 200, multiplexers 206(0), . . . , 206(3) select the sets of 72 five-bit Q messages that they receive from VNUs 204(0), . . . , 204(71) to output to 72-way cyclic shifters 208(0), . . . , 208(3), respectively. For the following discussion, it will be understood that any reference to Q messages, applies to soft values $L_n^{(0)}$ during the first iteration of LDPC decoder 200.

Cyclic shifters 208(0), . . . , 208(3) cyclically shift the sets of 72 five-bit Q messages that they receive based on a cyclic-shift signal that may be received from, for example, controller 214. The cyclic-shift signal corresponds to cyclic-shift factors of the circulants of H-matrix 100 of FIG. 1. For example, during the first clock cycle of an iteration of LDPC decoder 200, cyclic shifters 208(0), . . . , 208(3) may shift their respective sets of 72 five-bit Q messages based on the shift factors of circulants $B_{1,1}$, $B_{2,1}$, $B_{3,1}$, and $B_{4,1}$ of H-matrix 100 of FIG. 1, respectively. During the second clock cycle of an iteration of LDPC decoder 200, cyclic shifters 208(0), . . . , 208(3) shift their respective sets of 72 five-bit Q messages based on the shift factors of circulants $B_{1,2}$, $B_{2,2}$, $B_{3,2}$, and $B_{4,2}$, respectively. Cyclic shifters 208(0), . . . , 208(3) then provide their respective 72 cyclically-shifted five-bit Q messages to CNUs 210(0), . . . , 210(287), such that each CNU 210 receives a different one of the Q messages.

Each CNU 210 (i) receives a number of five-bit Q messages equal to the hamming weight $w_r$ of a row of H-matrix 100 (e.g., 10) at a rate of one Q message per clock cycle and (ii) generates $w_r$ five-bit check-node messages (herein referred to as R messages). Each R message may be generated using a suitable check-node algorithm, such as the offset min-sum algorithm, characterized by Equations (1), (2), and (3) shown below:

$$R_{mn}^{(i)} = \delta_{mn}^{(i)}\max(\alpha\kappa_{mn}^{(i)} - \beta, 0) \quad (1)$$

$$\kappa_{mn}^{(i)} = |R_{mn}^{(i)}| = \min_{n' \in N(m)/n} |Q_{n'm}^{(i-1)}| \quad (2)$$

-continued $$\delta_{mn}^{(i)} = \left( \prod_{n' \in N(m)/n} \text{sign}(Q_{n'm}^{(i-1)}) \right), \quad (3)$$

where (i) $R_{mn}^{(i)}$ represents the R message corresponding to $m^{th}$ check node (i.e., row) and the $n^{th}$ variable node (i.e., column) of H-matrix 100 of FIG. 1 for the $i^{th}$ iteration of LDPC decoder 200, (ii) $Q_{nm}^{(i-1)}$ represents the Q message corresponding to the $n^{th}$ variable node and the $m^{th}$ check node of H-matrix 100 for the $(i-1)^{th}$ iteration, (iii) α represents a scaling factor, which ranges from 0 to 1, (iv) β represents an offset value, which ranges from 0 to 15, and (v) the function sign indicates that the multiplication operation (i.e., Π) is performed on the signs of the $Q_{nm}^{(i-1)}$ messages. Suppose that n' is a variable node in the set N(m)/n of all variable nodes connected to the $m^{th}$ check node except for the $n^{th}$ variable node (i.e., n'∈N(m)/n). The CNU 210 corresponding to the $m^{th}$ check node (i.e., row) generates message $R_{mn}^{(i)}$ based on all Q messages received during the previous $(i-1)^{th}$ iteration from the set N(m)/n. Thus, in the embodiment of FIG. 2, each R message is generated based on N(m)/n=nine Q messages (i.e., $w_r-1=10-1$). Note that, for the first iteration, soft values $L_n^{(0)}$ received from soft-value memory 202 are used in Equations (2) and (3) in lieu of the Q messages for the prior iteration (i.e., $Q_{n'm}^{(0)} = L_{n'm}^{(0)}$).

Cyclic shifters 212(0), ..., 212(3) receive sets of 72 five-bit R messages from their respective CNUs 210 and cyclically shift the sets of 72 five-bit R messages according to the cyclic shifts of the circulants $B_{j,k}$ of H-matrix 100 of FIG. 1. Essentially, cyclic shifters 212(0), ..., 212(3) reverse the cyclic shifting of cyclic shifters 208(0), ..., 208(3). For example, if cyclic shifters 208(0), ..., 208(3) perform cyclic upshifting, then cyclic shifters 212(0), ..., 212(3) may perform cyclic downshifting.

Cyclic shifters 212(0), ..., 212(3) provide 4×72 cyclically-shifted five-bit R messages to VNUs 204(0), ..., 204(71), such that each VNU 204 receives four of the R messages, one from each cyclic shifter 212. Each VNU 204 updates each of the four five-bit Q messages that it generates as shown in Equation (4):

$$Q_{mn}^{(i)} = L_n^{(0)} + \sum_{m' \in M(n)/m} R_{m'n}^{(i-1)}, \quad (4)$$

where m' is a check node in the set M(n)/m of all check nodes connected to the $n^{th}$ variable node except the $m^{th}$ check node (i.e., m'∈M(n)/m). The $n^{th}$ variable node generates message $Q_{nm}^{(i)}$ based on (i) all R messages received during the previous $(i-1)^{th}$ iteration from the set M(n)/m and (ii) an initial soft value $L_n^{(0)}$ received from soft-value memory 202 that corresponds to the $n^{th}$ variable node. Each VNU 204, which may be implemented using adder circuits, outputs the four updated five-bit Q messages that it generates, such that a different one of the four messages is provided to a different corresponding MUX 206.

In addition to outputting four updated five-bit Q messages, each VNU 204 outputs (i) a seven-bit extrinsic LLR message, (ii) a hard-decision output bit, and (iii) an eight-bit P message. Each seven-bit extrinsic LLR message may be represented as shown in Equation (5):

$$\text{Extrinsic Value}_n = \sum_{m \in M(n)} R_{mn}^{(i)}, \quad (5)$$

where m is a check node in the set M(n) of all check nodes connected to the $n^{th}$ variable node (i.e., m∈M(n)). Each eight-bit P message may be generated using Equation (6) as follows:

$$P_n = L_n^{(0)} + \sum_{m \in M(n)} R_{mn}^{(i)}, \text{ and} \quad (6)$$

each hard-decision bit $\hat{x}_n$ may be represented as shown in Equations (7) and (8) below:

$$\hat{x}_n = 0 \text{ if } P_n \geq 0 \quad (7)$$

$$\hat{x}_n = 1 \text{ if } P_n < 0. \quad (8)$$

$P_n$ is determined for each variable node by adding the extrinsic value from Equation (5) to the initial soft value $L_n^{(0)}$ received from soft-value memory 202 that corresponds to the $n^{th}$ variable node. If $P_n$ is greater than or equal to zero, then the hard-decision bit $\hat{x}_n$ is equal to zero, as shown in Equation (7). If $P_n$ is less than zero, then the hard-decision bit $\hat{x}_n$ is equal to one, as shown in Equation (8). Each hard-decision bit $\hat{x}_n$ may be determined by taking the most-significant bit (MSB) of a P message.

A parity check is then performed by, for example, a syndrome check calculator, using the hard-decision values to determine whether LDPC decoder 200 has converged on a valid codeword (i.e., a codeword that may be generated using H-matrix 100). In particular, a 720-element vector $\hat{x}$ formed from 720 hard-decision bits $\hat{x}_n$ output from VNUs 204(0), ..., 204(71) during ten clock cycles is multiplied by the transpose $H^T$ of H-matrix 100 of FIG. 1 to generate a 288-bit vector, where each bit of the 288-bit vector corresponds to one of the 288 check nodes (i.e., rows) of H-matrix 100. If one or more elements of the resulting 288-bit vector is equal to one (i.e., $\hat{x}H^T \neq 0$), then LDPC decoder 200 has not converged on a valid codeword. Each element of the 288-bit vector that has a value of one is considered an unsatisfied check node, and each element of the 288-bit vector that has a value of zero is either (i) a satisfied check node or (ii) a missatisfied check node (i.e., a check node that falsely shows as satisfied).

If each element of the resulting 288-bit vector is equal to zero (i.e., $\hat{x}H^T = 0$), then LDPC decoder 200 has converged on a valid codeword and a cyclic-redundancy check (CRC) may be performed by, for example, controller 214 to determine whether the valid codeword is the correct codeword (i.e., the codeword that was transmitted). When a CRC is performed, typically a number r of CRC bits are appended to the user data at the transmitter before LDPC encoding such that, upon decoding, the 720-element vector $\hat{x}$ output from VNUs 204(0), ..., 204(71) comprises (i) the user data transmitted by the transmitter and (ii) the r CRC bits. To perform the CRC, the user data may be divided by a keyword that is known a priori by the receiver and the remainder of the division process may be compared to the r CRC bits. If the remainder is equal to the r CRC bits, then LDPC decoder 200 has converged on the correct codeword. If the remainder is not equal to the r CRC bits, then LDPC decoder 200 has not converged on the correct codeword.

If LDPC decoder 200 does not converge on the correct codeword, then further action is needed to properly recover the correct codeword. For example, subsequent local iterations of LDPC decoder 200 may be performed to converge on the correct codeword, where each pass through LDPC decoder 200 is considered to be a local iteration. As another example, a global iteration may be performed, whereby (i) the extrinsic LLR values are fed back to the upstream processor, (ii) the detector generates a new set of 720 five-bit soft values $L_n^{(0)}$, and (iii) LDPC decoder 200 attempts to recover the correct codeword from the new set of 720 five-bit soft values $L_n^{(0)}$. If LDPC decoder 200 does not converge on the correct codeword within a predefined number of local and/or global iterations, then the receiver and/or LDPC decoder may take further action to recover the correct codeword, such as perform other methods designed to break trapping sets. In some cases, LDPC decoder 200 might not be capable of recovering the correct codeword, and the receiver in which LDPC decoder 200 resides may need to request a retransmission of the data.

Figure 3:
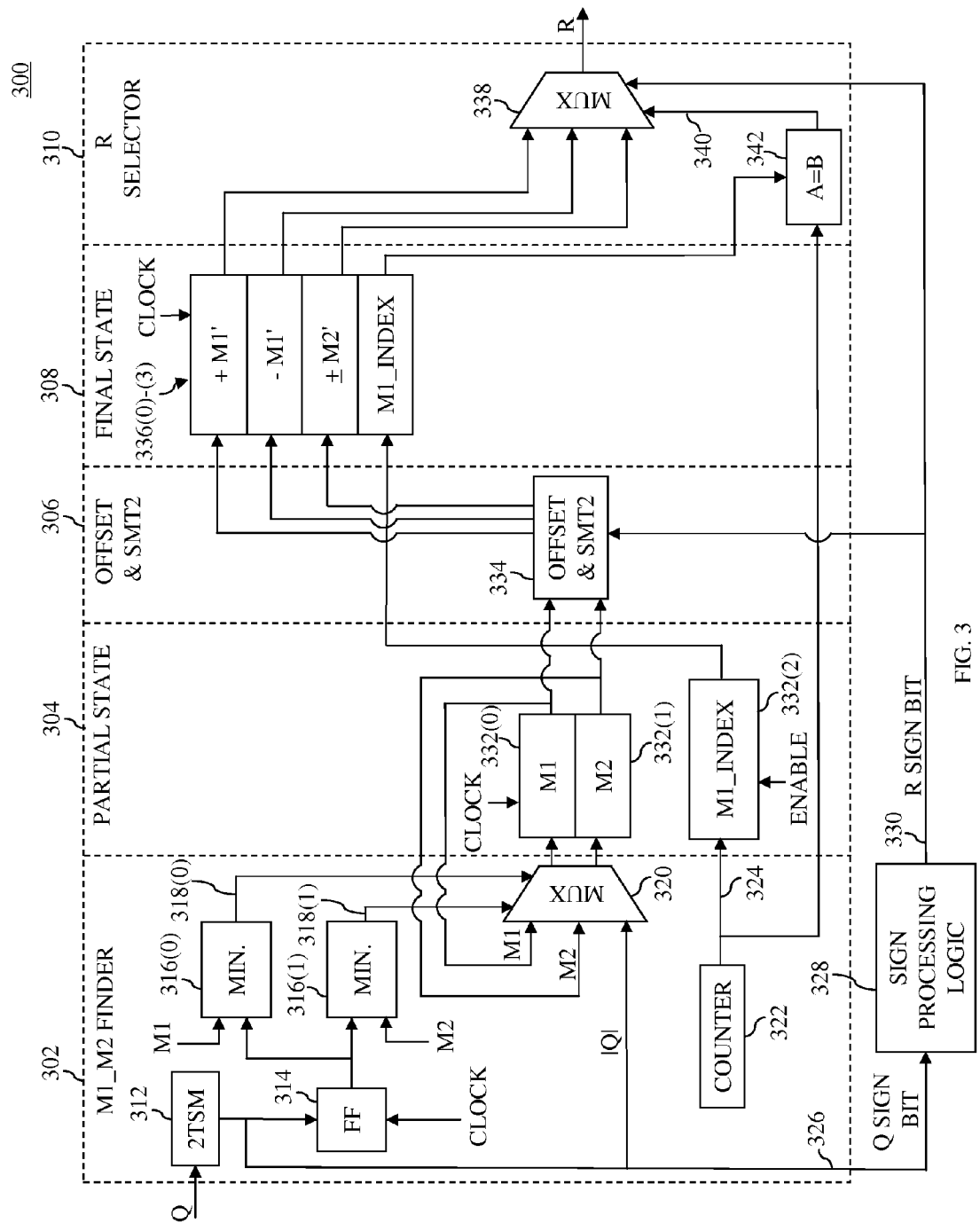
FIG. 3 shows a simplified block diagram of one implementation of a check-node unit (CNU) that may be used to implement each CNU of the LDPC decoder of FIG. 2.

FIG. 3 shows a simplified block diagram of one implementation of a CNU 300 that may be used to implement each CNU 210 of LDPC decoder 200 of FIG. 2. In general, CNU 300 generates ten five-bit R messages, where each five-bit R message is generated using a set N(m)/n of nine Q messages (one message is excluded as described above). For nine of these ten five-bit R messages, the minimum (i.e., smallest) magnitude of the Q messages generated using Equation (2) is the same. For one of these R messages, the smallest magnitude of the Q messages will be the second-smallest magnitude of the Q messages because the smallest magnitude of the Q messages will be excluded from the calculation as described above. Rather than performing Equation (2) ten times, once for each of the ten five-bit R messages, CNU 300 implements a value-reuse technique, wherein CNU 300 (i) determines the Q messages with the smallest and second-smallest magnitudes, (ii) stores the smallest and second-smallest magnitude values M1 and M2, and (iii) generates the ten five-bit R messages based on the smallest and second-smallest magnitudes. Storing the smallest and second-smallest magnitude values M1 and M2 requires less memory than storing all ten five-bit R messages. This memory savings may be relatively substantial for LDPC decoders such as LDPC decoder 200 that implement a plurality of CNUs.

During each of the first ten clock cycles, M1_M2 finder 302 receives a five-bit Q message in two's-complement format. M1_M2 finder 302 converts each Q message from two's-complement format to a five-bit sign-magnitude value using two's-complement-to-sign-magnitude (2TSM) converter 312. The sign bit 326 of the sign-magnitude Q message (i.e., the Q sign bit) is provided to sign processing logic 328, which (i) generates a product of the Q sign bits 326 of all ten Q messages and (ii) multiplies each Q sign bit 326 by the product to generate a different sign bit (i.e., R sign bit 330) for each of the ten R messages. The four-bit magnitude |Q|[3:0] of the five-bit sign-magnitude value Q[4:0] is provided to multiplexer (MUX) 320 along with the four-bit smallest magnitude value M1 and the four-bit second-smallest magnitude value M2 stored in partial-state registers 332(0) and 332(1) of partial-state memory 304, respectively. In addition, the four-bit magnitude value |Q|[3:0] is provided to flip-flop (FF) 314, which synchronizes the timing of CNU 300 with the clock signal of LDPC decoder 200.

Minimum operator 316(0) compares the magnitude value |Q| to smallest magnitude value M1 stored in register 332(0). If the magnitude value |Q| is smaller than smallest magnitude value M1, then minimum operator 316(0) asserts control signal 318(0) (i.e., sets 318(0) equal to 1). Otherwise, minimum operator 316(0) de-asserts control signal 318(0) (i.e., sets 318(0) equal to 0). Similarly, minimum operator 316(1) compares the magnitude value |Q| to second-smallest magnitude value M2 stored in register 332(1). If the magnitude value |Q| is smaller than M2, then control signal 318(1) is asserted. Otherwise, control signal 318(1) is de-asserted. Note that, before the first clock cycle, the smallest and second-smallest magnitude values M1 and M2 are initialized to suitably large values (e.g., binary 1111), and M1_index (discussed below) is initialized to 0. To further understand the operation of MUX 320, consider the logic table of Table I for magnitude value |Q|.

TABLE I

Multiplexer 320 Logic Table

| Control Signal 318(0) | Control Signal 318(1) | Output to 332(0) | Output to 332(1) |
|---|---|---|---|
| 0 (|Q| ≥ M1) | 0 (|Q| ≥ M2) | M1 | M2 |
| 0 (|Q| ≥ M1) | 1 (|Q| < M2) | M1 | |Q| |
| 1 (|Q| < M1) | 0 (|Q| ≥ M2) | N/A | N/A |
| 1 (|Q| < M1) | 1 (|Q| < M2) | |Q| | M1 |

Table I shows that, if control signals 318(0) and 318(1) are both de-asserted (i.e., |Q|≥M1 and M2), then magnitude value |Q| is discarded, and the previously stored smallest and second-smallest magnitude values M1 and M2 are retained in M1 register 332(0) and M2 register 332(1), respectively. If control signal 318(0) is de-asserted and control signal 318(1) is asserted (i.e., M2>|Q|≥M1), then (i) smallest magnitude value M1 is retained in M1 register 332(0), (ii) magnitude value |Q| is stored in M2 register 332(1), and (iii) previously stored second-smallest magnitude value M2 is discarded. If control signals 318(0) and 318(1) are both asserted (i.e., |Q|<M1 and M2), then (i) magnitude value |Q| is stored in M1 register 332(0), (ii) the previously stored smallest value M1 is stored in M2 register 332(1), and (iii) the second-smallest value M2 is discarded. In addition to storing magnitude value |Q| in M1 register 332(0), M1_index register 332(2) is enabled, counter value 324 (generated by counter 322) corresponding to the new smallest value M1 is stored in M1_index register 332(2), and the counter value previously stored in M1_index register 332(2) is discarded. Note that it is not possible that control signal 318(0) will be asserted and control signal 318(1) will be de-asserted because this would indicate that the magnitude value |Q| is smaller than smallest magnitude value M1 but larger than second-smallest magnitude value M2.

After all ten Q messages have been considered, processing logic 334 of offset-and-sign-magnitude-to-two's-complement (SMT2) processor 306 offsets four-bit smallest magnitude value M1 and four-bit second-smallest magnitude value M2 by offset value β as shown in Equation (1) to generate four-bit offset smallest magnitude value M1' and four-bit offset second-smallest magnitude value M2'. Processing logic 334 converts four-bit offset smallest magnitude value M1' into two's-complement format and appends a positive sign bit to generate a five-bit positive value (+M1'), which is subsequently stored in register 336(0) of final-state processor 308. Processing logic 334 also converts four-bit offset smallest magnitude value M1' into two's-complement format and appends a negative sign bit to generate a five-bit negative value (−M1'), which is subsequently stored in register 336(1). In addition, if R sign bit 330 from sign processing logic 328 is a positive sign bit (0), then processing logic 334 converts four-bit offset second-smallest magnitude value M2' into a five-bit positive two's-complement value (+M2') for storage in register 336(2). If R sign bit 330 from sign processing logic 328 is a negative sign bit (1), then processing logic 334 converts four-bit offset second-smallest magnitude value M2' into a five-bit negative two's-complement value (−M2') for storage in register 336(2). Register 336(3) of final-state processor 308 stores the counter value M1_INDEX from M1_index register 332(2).

During each of the next ten clock cycles, MUX 338 of R selector 310 outputs a five-bit R message based on (1) the positive value (+M1'), (2) the negative value (−M1'), (3) the positive or negative value (M2'), (4) a comparison bit 340 from comparison operator 342, and (5) the corresponding sign bit 330 from sign processing logic 328. Each comparison bit 340 is generated by comparing current counter value 324 to the M1_index value stored in register 336(3). When the two are equal, comparison bit 340 is asserted, and when the two are not equal, comparison bit 340 is de-asserted. Each R sign bit 330 may be generated as $\delta_{mn}^{(i)}$ using Equation (3), or alternatively, in the event that sign processing logic 328 is implemented using a FIFO, by multiplying a stored sign bit 326, as it is output from the FIFO, by the product of all sign bits 326 stored in sign processing logic 328 using an XOR gate. To further understand how R messages are output from MUX 338, consider the logic table of Table II.

TABLE II

Multiplexer 338 Logic Table

| Comparison Bit 340 | R Sign Bit 330 | Output |
|---|---|---|
| 0 (A ≠ B) | 0 | +M1' |
| 0 (A ≠ B) | 1 | −M1' |
| 1 (A = B) | 0 | +M2' |
| 1 (A = B) | 1 | −M2' |

Table II shows that, if both comparison bit 340 and R sign bit 330 are de-asserted, then the positive value (+M1') stored in register 336(0) will be output as the five-bit R message. If comparison bit 340 is de-asserted and R sign bit 330 is asserted, then the negative value (−M1') stored in register 336(1) will be output as the five-bit R message. If comparison bit 340 is asserted and R sign bit 330 is de-asserted, then the positive value (+M2') will have been stored in register 336(2) and will now be output as the five-bit R message. If both comparison bit 340 and R sign bit 330 are asserted, then the negative value (−M2') will have been stored in register 336(3) and will now be output as the five-bit R message.

Figure 4:
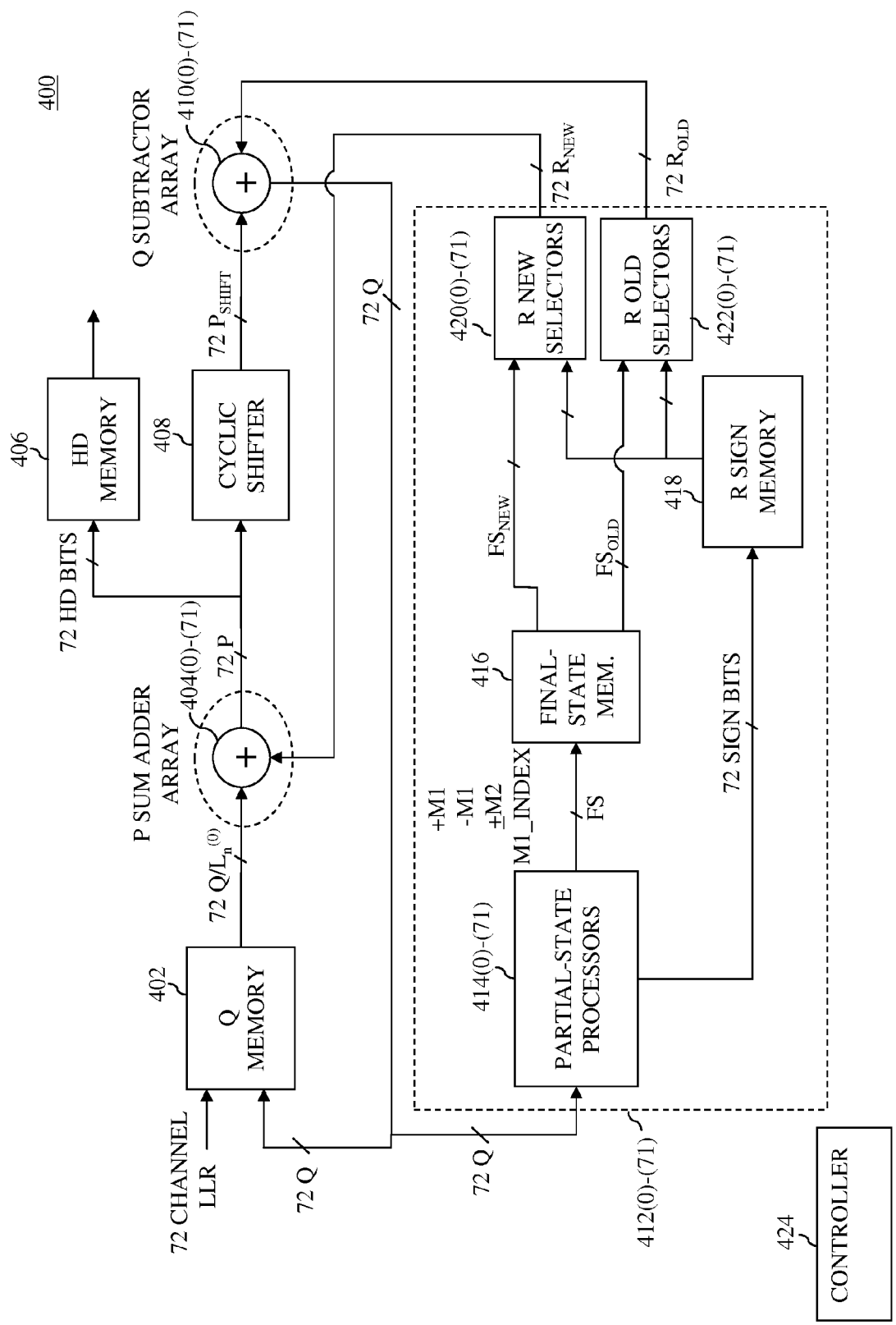
FIG. 4 shows a simplified block diagram of one implementation of a layered LDPC decoder that may be used to recover codewords encoded using an H-matrix such as the H-matrix of FIG. 1.

FIG. 4 shows a simplified block diagram of one implementation of a layered LDPC decoder 400 that may be used to recover codewords encoded using an H-matrix such as H-matrix 100 of FIG. 1. Similar to LDPC decoder 200 of FIG. 2, LDPC decoder 400 receives 720 soft values (e.g., log-likelihood ratios (LLR)) $L_n^{(0)}$ for each codeword received from an upstream processor, where each soft value $L_n^{(0)}$ corresponds to one bit of the codeword. For this discussion, it will again be assumed that each soft value $L_n^{(0)}$ has five bits, including one hard-decision bit and a four-bit confidence value.

LDPC decoder 400 iteratively decodes the 720 soft values $L_n^{(0)}$ (i.e., messages) using a block-serial message-passing schedule. In general, LDPC decoder 400 updates the messages of H-matrix 100 one layer at a time, where each block row of H-matrix 100 may be considered a layer. Each pass of LDPC decoder 400 is considered a sub-iteration, and each full iteration comprises four sub-iterations, one for each layer. In general, during the first sub-iteration LDPC decoder 400 updates the check-node (i.e., row) messages for the first layer (i.e., circulants $B_{1,1}, B_{1,2}, \ldots, B_{1,10}$). During the second sub-iteration, the updated check-node messages for the first layer are used to update the variable-node (i.e., column) messages for the first layer, and the resulting updated variable-node messages for the first layer are used to update the check-node (i.e., row) messages for the second layer (i.e., circulants $B_{2,1}, B_{2,2}, \ldots, B_{2,10}$). During the third sub-iteration, the updated check-node messages for the second layer are used to update the variable-node (i.e., column) messages for the second layer, and the resulting updated variable-node messages for the second layer are used to update the check-node (i.e., row) messages for the third layer (i.e., circulants $B_{3,1}, B_{3,2}, \ldots, B_{3,10}$). During the fourth sub-iteration, the updated check-node messages for the third layer are used to update the variable-node (i.e., column) messages for the third layer, and the updated variable-node messages for the third layer are used to update the check-node (i.e., row) messages for the fourth layer (i.e., circulants $B_{3,1}, B_{3,2}, \ldots, B_{3,10}$). At the end of the fourth sub-iteration, a full iteration is complete, and this process may be repeated for subsequent sub-iterations. Note that, during the during the first sub-iteration of the next iteration, the updated check-node messages for the fourth layer are used to update the variable-node (i.e., column) messages for the fourth layer, and the resulting updated variable-node messages for the fourth layer are used to update the check-node (i.e., row) messages for the first layer.

During the first sub-iteration, the 720 five-bit soft values $L_n^{(0)}$ are provided at a rate of 72 soft values $L_n^{(0)}$ per clock cycle to Q memory 402. After storing the 720 soft values $L_n^{(0)}$, Q memory 402 provides the soft values $L_n^{(0)}$ to combiners 404(0)-(71) at a rate of 72 soft values $L_n^{(0)}$ per clock cycle such that each combiner 404 receives a different soft value $L_n^{(0)}$ in each set of 72 soft values $L_n^{(0)}$. The soft values $L_n^{(0)}$ may be output from Q memory 402 in an order that is different from the order in which they were received, and the order in which the soft values $L_n^{(0)}$ are output may be controlled by, for example, controller 424. During subsequent sub-iterations, Q memory 402 provides 720 variable-node messages (i.e., Q messages) received from combiners 410(0)-(71) to combiners 404(0)-(71) at a rate of 72 Q messages per clock cycle. The Q messages are generated during the previous sub-iteration, and similar to the soft values $L_n^{(0)}$, the Q messages may be output in an order that is different from the order in which they were received. For the following discussion, it will be understood that any reference to Q messages, applies to soft values $L_n^{(0)}$ during the first sub-iteration of LDPC decoder 400.

During each sub-iteration, each combiner 404 receives a number of five-bit Q messages equal to the hamming weight $w_r$ of a row of H-matrix 100 (e.g., 10) at a rate of one Q message per clock cycle. For each Q message received, the combiner 404 generates a P message by adding the Q message that it receives to a new check-node message $R_{NEW}$ as shown below in Equation (9):

$$P_n^{(i,l)} = Q_{nm}^{(i,l)} + R_{mn}^{(i,l)} \qquad (9)$$

where (i) $P_n^{(i,l)}$ represents the P message corresponding to the $n^{th}$ variable node (i.e., column) of H-matrix 100 of FIG. 1 for the $i^{th}$ iteration and $i^{th}$ sub-iteration, (ii) $R_{mn}^{(i,l)}$ represents a new check-node message $R_{NEW}$ corresponding to the $m^{th}$ check node (i.e., row) and the $n^{th}$ variable node of H-matrix 100, and (iii) $Q_{nm}^{(i,l)}$ represents the Q message corresponding to the $n^{th}$ variable node and the $m^{th}$ check node of H-matrix 100. Note that, for the first sub-iteration l=1 of the first iteration i=1, $Q_{nm} = L_n^{(0)}$ and each $R_{NEW}$ message may be initialized to zero (i.e., $R_{mn}^{(0,0)} = 0$) such that $P_n = L_n^{(0)}$.

Combiners 404(0)-(71) output (i) sets of 72 P messages to cyclic shifter 408 and (ii) sets of 72 hard-decision bits $\hat{x}_n$ to hard-decision (HD) memory 406. Each hard-decision bit $\hat{x}_n$ which may be represented as shown in Equations (7) and (8) above, is determined by taking the most-significant bit (MSB) of a corresponding one of the P messages. HD memory 406 stores the hard-decision bits and outputs the bits to, for example, a syndrome checker which performs a syndrome check in a manner similar to that described above in relation to LDPC decoder 200 of FIG. 2. The syndrome check may be performed every time a layer of H-matrix 100 is processed by LDPC decoder 400 (e.g., every sub-iteration).

Cyclic shifter 408 cyclically shifts each set of 72 P messages based on a cyclic-shift signal that may be received from, for example, controller 424. The cyclic-shift signal corresponds to cyclic-shift factors of the circulants of H-matrix 100 of FIG. 1. Cyclic shifter 408 then provides the sets of 72 cyclically-shifted P messages $P_{SHIFT}$ to combiners 410(0)-(71), such that each combiner 410 receives a different one of the shifted P messages $P_{SHIFT}$ in each set of 72 cyclically-shifted P messages $P_{SHIFT}$.

Each combiner 410, which for purposes of this application will also be known as a check-node unit, receives a number of cyclically-shifted P messages $P_{SHIFT}$ equal to the hamming weight $w_r$ of a row of H-matrix 100 (e.g., 10) at a rate of one $P_{SHIFT}$ message per clock cycle. For each $P_{SHIFT}$ message received, the combiner 410 updates a Q message by subtracting an old check-node message $R_{OLD}$ from the $P_{SHIFT}$ message as shown in Equation (10) below:

$$Q_{nm}^{(i,l)} = P_n^{s(i,l)} - R_{mn}^{(i-1,l)} \qquad (10)$$

where (i) $P_n^{s(i,l)}$ represents the cyclically-shifted P message $P_{SHIFT}$ and (ii) $R_{nm}^{(i-1,l)}$ represents the $R_{OLD}$ message, which may be initialized to zero for the first sub-iteration l=0 of the first iteration i=0. The updated Q messages are fed (i) back to Q memory 402 for use in processing the next layer of H-matrix 100 and (ii) to partial-state processors 414(0)-(71).

Partial-state processors 414(0)-(71), final-state memory 416, R sign memory 418, R new selectors 420(0)-(71), and R old selectors 422(0)-(71) operate together as 72 CNUs 412(0)-(71) to generate R messages. In general, during each sub-iteration, each CNU 412 (i) receives a number of five-bit Q messages equal to the hamming weight $w_r$ of a row of H-matrix 100 (e.g., 10) at a rate of one Q message per clock cycle and (ii) generates $w_r$ five-bit R messages. Each R message generated by the CNU 412 is used by LDPC decoder 400 during two successive iterations. Each R message that is output during the current iteration is shown as $R_{NEW}$ and each R message that is output during the subsequent iteration is shown as $R_{OLD}$. During the current iteration, each $R_{NEW}$ message is used to update a P message as described above in relation to Equation (9), and during the subsequent iteration, each $R_{OLD}$ message is used to update a Q message as described above in relation to Equation (10).

Each partial-state processor 414 implements processing analogous to M1_M2 finder 302, partial-state memory 304, and offset-and-SMT2 processor 306 of FIG. 3 to generate four final-state (FS) values: (i) a positive value (+M1'), (ii) a negative value (−M1'), (iii) either a positive or negative value (+M2'), and (iv) an index value (M1_index) for each set of $w_r$ Q messages received. In addition, each partial-state processor 414 implements processing analogous to sign processing logic 328 to generate $w_r$ R sign bits (e.g., R sign bits 330) for each set of $w_r$ Q messages received. The set of four final-state values are subsequently stored in final-state memory 416, and the $w_r$ R sign bits are stored in R sign memory 418. Final-state memory 416 may be sized to store a set of four final-state values for each row of H-matrix 100 (e.g., 4 values×5 bits/value×288 rows=5,760 total bits) and R sign memory 418 may be sized to store $w_r$ R sign bits for each row of H-matrix 100 (e.g., 10 sign bits×288 rows=2,880 total bits).

Final-state memory 416 provides 72 sets of four final-state values to R new selectors 420(0)-(71) each sub-iteration such that each R new selector 420 receives a different one of the 72 sets. Additionally, for each set of four final-state values received, each R new selector 420 receives a set of $w_r$ corresponding R sign bits from R sign memory 418 at a rate of one R sign bit per clock cycle. Each new R selector 420 performs operations analogous to R selector 310 of FIG. 3 to generate $w_r$ five-bit $R_{NEW}$ messages based on the four final-state values and the $w_r$ R sign bits received.

The $w_r$ five-bit $R_{NEW}$ messages for all 288 rows of H-matrix 100 (e.g., 10 messages×5 bits/message×288 rows=14,400 total bits) could be stored until the next iteration and could be output during the next iteration as $R_{OLD}$ messages. However, to reduce the amount of memory, CNUs 412(0)-(71) store only the four final-state values (e.g., 5,760 total bits) and the $w_r$ sign bits (e.g., 2,880 total bits) for each row of H-matrix 100. Thus, the amount of memory may be reduced from 14,400 total bits to 8,640 total bits (e.g., 5,760+2,880) of memory. Then, during the subsequent iteration, each set of four FS values and each set of corresponding $w_r$ sign bits are provided to an R old selector 422, which performs operations analogous to R selector 310 of FIG. 3 to generate $w_r$ $R_{OLD}$ messages.

In attempting to recover the correct LDPC-encoded codeword, a non-layered LDPC decoder such as LDPC decoder 200 of FIG. 2 or a layered decoder such as LDPC decoder 400 of FIG. 4 might converge on a trapping set that prevents the decoder from correctly recovering the codeword. Convergence on a trapping set may be indicated by relatively sudden changes in the magnitudes of the messages that are updated by the LDPC decoder. Such sudden changes may be prevented by averaging messages over one or more iterations. Averaging may lower the error-floor by slowing down the propagation of erroneous information to and from trapping-set variables. One method of averaging, which involves averaging of variable-node messages (Q messages), is discussed in Ländner, "Algorithmic and Combinatorial Analysis of Trapping Sets in Structural LDPC Codes," 2005 International Conference on Wireless Networks, Communications, and Mobile Computing, Vol. 1, pgs. 630-635, the teachings of which are incorporated herein by reference in their entirety. Another method of averaging that involves averaging check-node messages (R messages) is presented herein.

Figure 5:
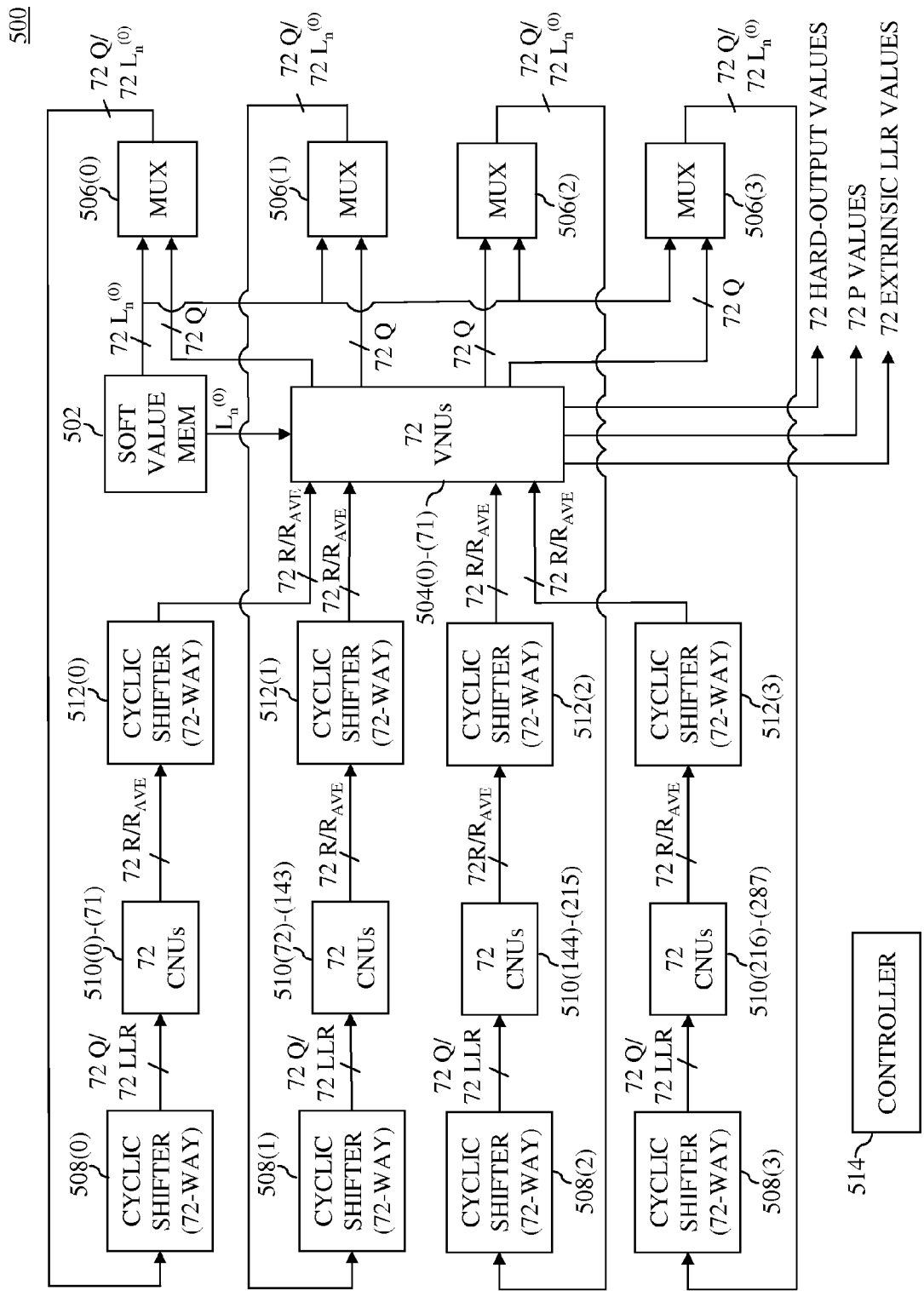
FIG. 5 shows a simplified block diagram of a non-layered LDPC decoder according to one embodiment of the present invention.

FIG. 5 shows a simplified block diagram of a non-layered LDPC decoder 500 according to one embodiment of the present invention. LDPC decoder 500 has soft-value memory 502, VNUs 504(0)-(71), multiplexers 506(0)-(3), cyclic shifters 508(0)-(3), and cyclic shifters 512(0)-(3), which perform operations similar to those of the analogous processing elements of LDPC decoder 200 of FIG. 2. LDPC decoder 500 also has CNUs 510(0)-(287), each of which is capable of operating in a first (non-averaging) operating mode to generate non-averaged check-node messages (R messages) and in a second (averaging) operating mode to generate averaged check-node messages ($R_{AVE}$). The operating mode may be selected by, for example, controller 514.

Upon receiving a new set of 720 soft values $L_n^{(0)}$, LDPC decoder 500 performs decoding in the first operating mode (i.e., without R message averaging) in a manner analogous to that described above in relation to LDPC decoder 200 of FIG. 2. If, after a predetermined number of iterations, LDPC decoder 500 does not converge on a valid codeword, then decoding may be restarted using the originally received set of 720 soft values $L_n^{(0)}$ and R message averaging. Upon restarting, LDPC decoder 500 may be switched from the first operating mode to the second operating mode during the first iteration (i.e., iteration 0) or after a predetermined number of iterations (e.g., after iterations 1 or 2) such that R message averaging is started during the first iteration or after a predetermined number of iterations. Once R message averaging is started, averaged R messages $R_{AVE}$ are provided to cyclic shifters 512(0)-(3) rather than non-averaged R messages.

Figure 6:
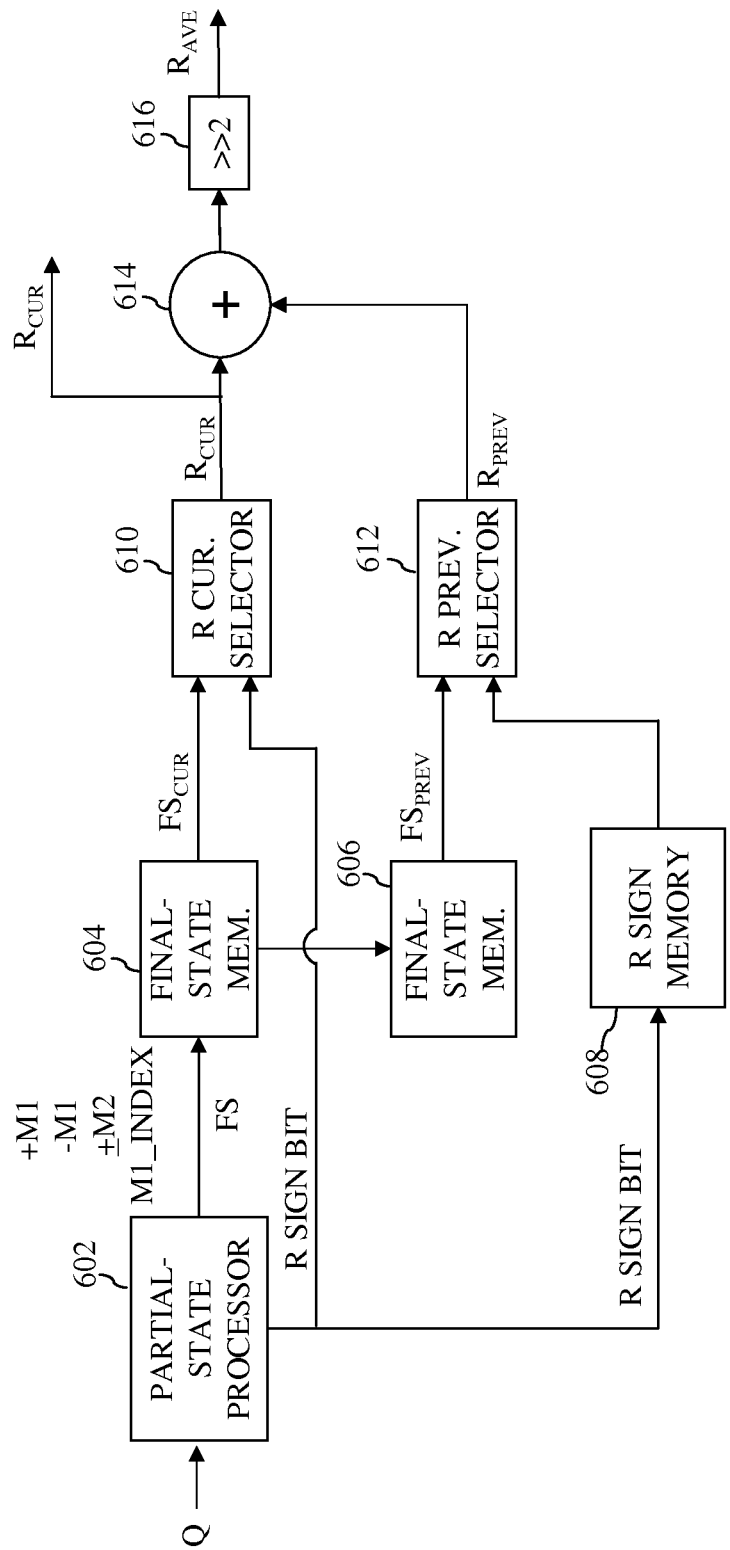
FIG. 6 shows a simplified block diagram of a CNU according to one embodiment of the present invention that may be used to implement each CNU of the LDPC decoder of FIG. 5.

FIG. 6 shows a simplified block diagram of a CNU 600 according to one embodiment of the present invention that may be used to implement each CNU 510 of FIG. 5. In non-averaging mode, CNU 600 (i) receives a number of five-bit Q messages equal to the hamming weight $w_r$ of a row of H-matrix 100 (e.g., 10) at a rate of one Q message per clock cycle, (ii) generates R messages ($R_{CUR}$) for the current iteration in a manner similar to that of CNU 300 of FIG. 3, and (iii) outputs the $R_{CUR}$ messages to, for example, a cyclic shifter such as a cyclic shifter 512 of FIG. 5. In averaging mode, CNU 600 (i) receives $w_r$ five-bit Q messages at a rate of one Q message per clock cycle, (ii) generates $w_r$ five-bit averaged R messages ($R_{AVE}$), and (iii) outputs the $R_{AVE}$ messages to, for example, cyclic shifter 512. Each $R_{AVE}$ message is generated by averaging an R message (i.e., $R_{CUR}$) for the current iteration (i.e., the $i^{th}$ iteration) with an R message (i.e., $R_{PREV}$) for the previous iteration (i.e., the $(i-1)^{th}$ iteration).

CNU 600 processes the current set of $w_r$ Q messages using partial-state processor 602, which implements processing analogous to (i) M1_M2 finder 302, partial-state memory 304, offset-and-SMT2 processor 306 of FIG. 3 to generate four final-state (FS) values: (i) a positive value (+M1'), (ii) a negative value (-M1'), (iii) either a positive or negative value (+M2'), and (iv) an index value (M1_index) for each set of $w_r$ Q messages received. In addition, partial-state processor 602 implements processing analogous to sign processing logic 328 to generate $w_r$ R sign bits for the set of $w_r$ Q messages received.

Partial-state processor 602 provides (i) the set of $w_r$ R sign bits to R sign memory 608 and R current selector 610 at a rate of one R sign bit per clock cycle, and (ii) the set of four final-state values to final-state memory 604, which may be implemented in a manner similar to final-state memory 308 of FIG. 3. Final-state memory 604 provides the four final-state values to (i) final-state memory 606 and (ii) R current selector 610. R current selector 610 performs operations analogous to R selector 310 of FIG. 3 to generate $w_r$ five-bit $R_{CUR}$ messages based on the four final-state values and the $w_r$ R sign bits.

To perform averaging, the $w_r$ five-bit $R_{CUR}$ messages (i.e., 10 R messages×5 bits/message=50 R message bits) could be stored until the next iteration and could be output during the next iteration as $w_r$ $R_{PREV}$ messages. However, to minimize memory requirements, CNU 600 stores the four final-state values (i.e., 4 messages×4 bits/message=16 final-state bits) in final-state memory 606 and the $w_r$ sign bits (i.e., 10 final-state bits) in R sign memory 608. Thus, CNU 600 may store a total of 26 final-state bits as opposed to 50 R message bits. Note that, in an LDPC decoder such as LDPC decoder 500, which implements 288 CNUs, the decoder may store 7,488 final-state bits (26 bits/CNU×288 CNUs) as opposed to 14,4000 R message bits (50 bits/CNU×288 CNUs). Then, to generate $w_r$ $R_{PREV}$ messages, final-state memory 606 provides final-state values from the previous iteration ($FS_{PREV}$) to R previous selector 612, which performs operations analogous to R selector 310 of FIG. 3 to generate the $w_r$ $R_{PREV}$ messages. Note that, if averaging is started during the first iteration, then the four final-state values from the previous iteration ($FS_{PREV}$) may be initialized to zero. Alternatively, CNU 600 may be operated without averaging for a specified number of iterations, and then averaging may be started using four final-state values that were generated during the iteration just prior to the start of averaging.

Adder 614 receives the $w_r$ $R_{CUR}$ messages at a rate of one $R_{CUR}$ message per clock cycle and adds each $R_{CUR}$ message to a different $R_{PREV}$ message received from R previous selector 612. Each sum output from adder 614 is then divided by two using divider 616 to generate an averaged R message $R_{AVE}$. Note that, when using binary numbers, division may be accomplished by performing a right-shift operation on the output of adder 614.

Figure 7:
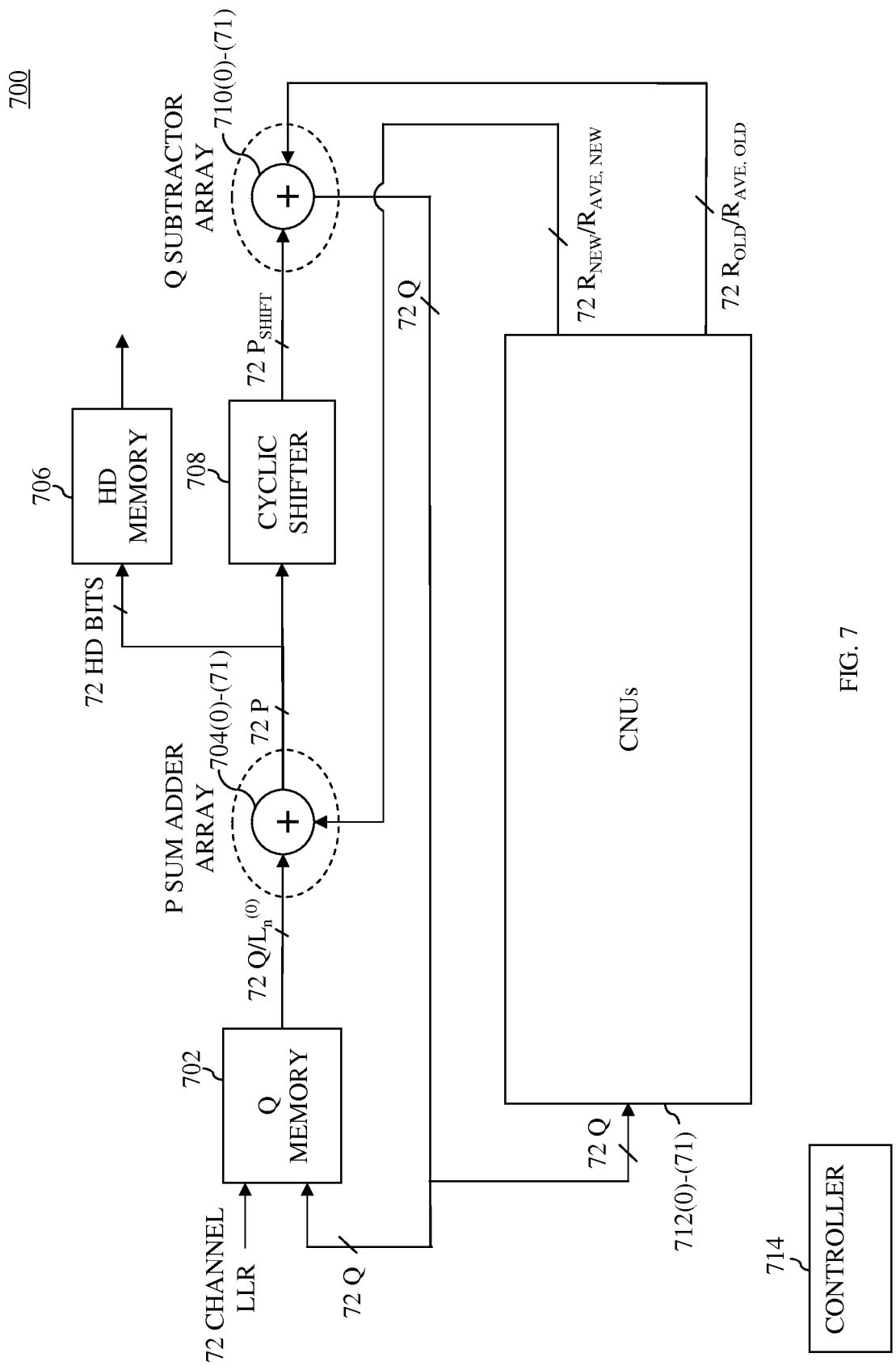
FIG. 7 shows a simplified block diagram of a layered LDPC decoder according to one embodiment of the present invention.

FIG. 7 shows a simplified block diagram of a layered LDPC decoder 700 according to one embodiment of the present invention. LDPC decoder 700 has Q memory 702, combiners 704(0)-(71), cyclic shifter 708, HD memory 706, and combiners 710(0)-(71), which perform operations similar to those of the analogous processing elements of LDPC decoder 400 of FIG. 4. LDPC decoder 700 also has CNUs 712(0)-(71), each of which is capable of operating (i) in a first a first (non-averaging) operating mode to generate non-averaged new check-node messages ($R_{NEW}$ messages) and non-averaged old check-node messages ($R_{OLD}$ messages) and (ii) in a second (averaging) operating mode to generate averaged new check-node messages ($R_{AVE,NEW}$) and averaged old check-node messages ($R_{AVE,OLD}$). The operating mode may be selected by, for example, controller 714.

Upon receiving a new set of 720 soft values $L_n^{(0)}$, LDPC decoder 700 performs decoding in the first operating mode (i.e., without R message averaging) in a manner analogous to that described above in relation to LDPC decoder 400 of FIG. 4. If, after a predetermined number of iterations, LDPC decoder 700 does not converge on a valid codeword, then decoding may be restarted using the originally received set of 720 soft values $L_n^{(0)}$ and R message averaging. Similar to LDPC decoder 500, upon restarting, LDPC decoder 700 may be switched from the first operating mode to the second operating mode during the first iteration (i.e., iteration 0) or after a predetermined number of iterations (e.g., after iterations 1 or 2) such that R message averaging is started during the first iteration or after a predetermined number of iterations. Once R message averaging is started, averaged new R messages $R_{AVE,NEW}$ are provided to combiners 704(0)-(71), and averaged old R messages $R_{AVE,OLD}$ are provided to combiners 710(0)-(71).

Figure 8:
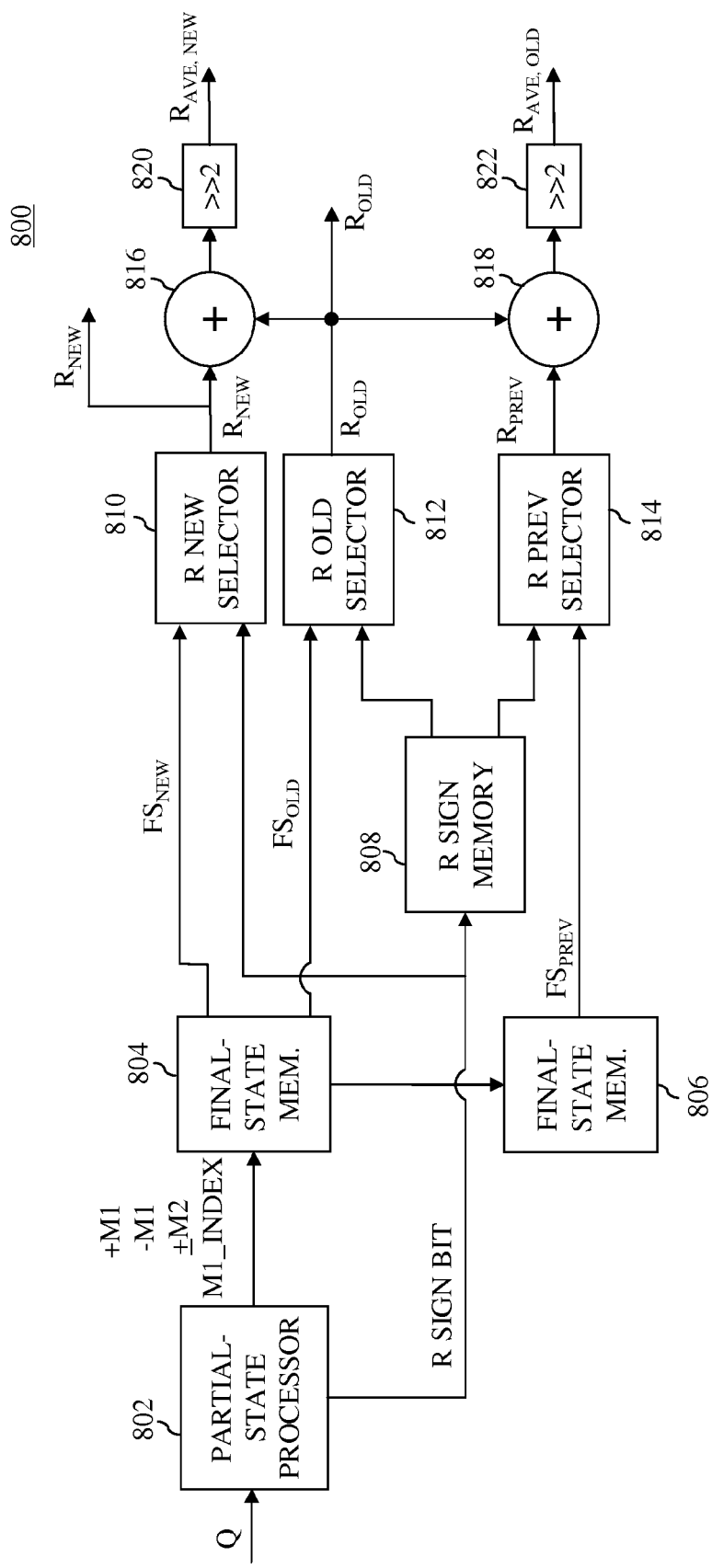
FIG. 8 shows a simplified block diagram of a CNU according to one embodiment of the present invention that may be used to implement each CNU of the LDPC decoder of FIG. 7.

FIG. 8 shows a simplified block diagram of a CNU 800 according to one embodiment of the present invention that may be used to implement each CNU 712 of FIG. 7. In non-averaging mode, during each sub-iteration, CNU 800 (i) receives $w_r$ five-bit Q messages at a rate of one Q message per clock cycle, (ii) generates R messages ($R_{NEW}$) for the current iteration and R messages ($R_{OLD}$) for the previous iteration in a manner similar to that of CNUs 412 of FIG. 4, and (iii) outputs the $R_{NEW}$ messages and the $R_{OLD}$ messages to, for example, combiners such as combiners 704 and 710 of FIG. 7, respectively.

In averaging mode, during each sub-iteration, CNU 800 (i) receives $w_r$ five-bit Q messages at a rate of one Q message per clock cycle, (ii) generates $w_r$ averaged five-bit R messages ($R_{AVE,NEW}$) for the current iteration (i.e., the $i^{th}$ iteration) and $w_r$ averaged five-bit $R_{OLD}$ messages ($R_{AVE,OLD}$) for the previous iteration (i.e., the $(i-1)^{th}$ iteration), and (iii) outputs the $R_{AVE,NEW}$ messages and the $R_{AVE,OLD}$ messages to, for example, combiners such as combiners 704 and 710 of FIG. 7, respectively. Each $R_{AVE,NEW}$ message is generated by averaging an R message (i.e., $R_{NEW}$) for the current iteration (i.e., the $i^{th}$ iteration) with an R message (i.e., $R_{OLD}$) for the previous iteration (i.e., the $(i-1)^{th}$ iteration), and each $R_{AVE,OLD}$ message is generated by averaging an R message (i.e., $R_{OLD}$) for the previous iteration (i.e., the $(i-1)^{th}$ iteration) with an R (i.e., $R_{PREV}$) message that is two iterations old (i.e., the $(i-2)^{th}$ iteration).

CNU 800 processes the current set of $w_r$ Q messages using partial-state processor 802, final-state memory 804, R new selector 810, and R old selector 812, which perform operations analogous to those of partial-state processors 414, final-state memory 416, R sign memory 808, R selectors 420, and R selectors 422 of FIG. 4 to generate $w_r$ $R_{NEW}$ messages and $w_r$ $R_{OLD}$ messages. To generate averaged new messages $R_{NEW}$, adder 816 (i) receives one of the $w_r$ $R_{NEW}$ messages and one of the $w_r$ $R_{OLD}$ messages per clock cycle and (ii) adds each pair of $R_{NEW}$ and $R_{OLD}$ messages together to generate a sum. Each sum output from adder 816 is then divided by two using divider 820 to generate an averaged new R message ($R_{AVE,NEW}$). Similar to divider 616 of FIG. 6, divider 820 may perform division using a right-shift operation.

To generate averaged old R messages, CNU 800 has final-state memory 806, which (i) receives final-state values from the previous iteration from final-state memory 804, (ii) stores the final-state values for an additional iteration, and (iii) provides four final-state values ($FS_{PREV}$) that are two iterations old to R previous selector 814. R previous selector 814 performs operations analogous to R selector 310 of FIG. 3 to generate R messages ($R_{PREV}$) that are two iterations old based on the $FS_{PREV}$ values and $w_r$ R sign bits that are two iterations old. The two-iteration-old $w_r$ R sign bits are received at a rate of one R sign bit per clock cycle from R sign memory 808, which is sized to store R sign bits for two iterations. Note that, similar to CNU 600 of FIG. 6, the final-state values are stored rather than the R messages to minimize memory requirements.

Adder 818 receives the $w_r$ $R_{OLD}$ messages and $w_r$ $R_{PREV}$ messages at a rate of one $R_{OLD}$ message and one $R_{PREV}$ message per clock cycle and adds each pair of $R_{OLD}$ and $R_{PREV}$ messages together. Each sum output from adder 818 is then divided by two using divider 822 to generate an averaged old R message ($R_{AVE,OLD}$). Similar to divider 616 of FIG. 6, divider 822 may perform division using a right-shift operation. Note that, if averaging is started during the first sub-iteration, then the four final-state values from the previous iteration ($FS_{OLD}$) and the four final-state values that are two iterations old ($FS_{PREV}$) may be initialized to zero. Alternatively, CNU 800 may be operated without averaging for a specified number of iterations, and then averaging may be started using $FS_{OLD}$ and $FS_{PREV}$ that were generated during the two iterations just prior to starting the averaging.

By using check-node message averaging, LDPC decoders of the present invention may reduce the occurrence of sudden changes in the magnitudes of the messages generated by the decoders compared to comparable LDPC decoders that do not implement averaging. Reducing such sudden changes may reduce the likelihood that the decoders will converge on a trapping set, and consequently, may improve the error-floor properties of the decoders.

Although embodiments of the present invention were described in relation to storing four final-state values per check node (i.e., row) of the H-matrix rather than $w_r$ R messages, the present invention is not so limited. Various embodiments of the present invention may be envisioned that store R messages rather then the final-state values. Embodiments that store R messages may have larger memory requirements than comparable embodiments that store final-state values.

Further, various embodiments may be envisioned that store more or fewer than four final-state values per check node. For example, in CNU 600 of FIG. 6, final-state memory 606 may store three final-state values M1', M2', and M1_index. Then, the R sign bits from partial-state processor 602 may be added by R current selector 610 to M1' and M2' to generate five-bit R current values (+M1', −M1', +M2', −M2') as appropriate. Similarly, the R sign bits from R sign memory 608 may be added by R previous selector 612 to M1' and M2' to generate five-bit R previous values (+M1', −M1', +M2', −M2') as appropriate. Storing three rather than four final-state values may further reduce memory requirements. As another example, CNU 600 may store five final-state values +M1', −M1', +M2', −M2', and M1_index.

Although embodiments of the present invention were described relative to generating R messages that are averaged over two iterations, the present invention is not so limited. The present invention may generate R messages that are averaged over two or more iterations. In general, the amount FS memory of additional final-state memory (in bits) that may be needed to perform averaging may be expressed as follows in Equation (11):

$$FS\ memory = M \times w_r \times l_{AVE} \times FS_W \quad (11)$$

where M is the number of check nodes (i.e., rows) of the H-matrix, $l_{AVE}$ is the number of iterations over which averaging is performed, and $FS_W$ is the total number final-state bits stored per check node (e.g., 4 messages×4 bits/message=16 final-state bits in FIG. 6). Further, the amount R sign memory of additional R sign memory (in bits) that may be needed to perform averaging may be expressed as shown in Equation (12) below:

$$R\ sign\ memory = M \times w_r \times l_{AVE} \quad (12)$$

According to various embodiments of the present invention, the controller (e.g., 514, 714) may perform an additional step to determine whether the decoder should be restarted using check-node message averaging. This decision may be based on, for example, the number of unsatisfied check nodes that are present after the initial predetermined number of iterations. If the number of unsatisfied check nodes is less than a specified threshold (e.g., 16), then it is likely that the decoder has encountered a trapping set. In this case, check-node message averaging may be performed to possibly break out of the trapping set. If the number of unsatisfied check nodes is greater than the threshold, then it is likely that there is an error in the communications channel, such as a flaw on a hard-disk drive. In this case, it might not be possible for the decoder to recover the correct codeword. Rather than restarting the decoder, the controller might, for example, request retransmission of the data.

Although the present invention was described as performing an initial attempt to recover the correct codeword in a non-averaging mode, the present invention is not so limited. The present invention may perform the initial attempt to recover the correct codeword using averaging.

Further, although the present invention has been described relative to specific layered and non-layered LDPC decoder configurations, the present invention is not so limited. Various embodiments of the present invention may also be envisioned for other LDPC decoder structures that employ message passing. For example, the present invention may be implemented for other non-layered or for layered decoder structures, and decoders that use message-passing schedules other than a block-serial message-passing schedule. As another example, LDPC decoders of the present invention may be implemented without using cyclic shifters. In such embodiments, the messages may be passed between CNUs and VNUs through direct connections or using permutators that perform non-cyclic shifting.

According to various embodiments, the present invention may be implemented using check-node algorithms other than the offset min-sum algorithm. For example, such embodiments may use a scaled min-sum algorithm, or algorithms other than the min-sum algorithm, such as a sum-product algorithm (SPA) or the Bahl-Cocke-Jelinek-Raviv (BCJR) algorithm.

Although the present invention was described relative to the specific H-matrix 100 of FIG. 1, the present invention is not so limited. The present invention may be implemented for various H-matrices that are the same size as or a different size from matrix 100 of FIG. 1. For example, the present invention may be implemented for H-matrices in which the number of columns, block columns, rows, block rows, layers (including implementations having only one layer), messages processed per clock cycle, the size of the sub-matrices, the size of the layers, and/or the column and/or row hamming weights differ from that of H-matrix 100. Such H-matrices may be, for example, quasi-cyclic, non-cyclic, regular, or irregular H-matrices. H-matrices that are non-cyclic do not have any sub-matrices that are obtained by cyclically shifting an identity matrix. H-matrices that are irregular do not have the same hamming weight $w_r$ for all rows and/or the same hamming weight $w_c$ for all columns. Further, such H-matrices may comprise sub-matrices other than circulants including zero matrices. Note that the number of VNUs, barrel shifters, and/or CNUs may vary according to the characteristics of the H-matrix.

It will be understood that the terms "adder" and "combiner" as used in the specification refer to hardware that may perform addition or subtraction operations.

It will be further understood that various changes in the details, materials, and arrangements of the parts which have been described and illustrated in order to explain the nature of this invention may be made by those skilled in the art without departing from the scope of the invention as expressed in the following claims. For example, rather than receiving Q messages and outputting R messages using two's-complement format, CNUs may receive and output messages in another format such as sign-magnitude format. Also, two's-complement-to-sign-magnitude conversion may be performed by, for example, the VNUs. As yet another example, LDPC decoders of the present invention may process messages of sizes other than five bits.

Although embodiments of the present invention have been described in the context of LDPC codes, the present invention is not so limited. Embodiments of the present invention could be implemented for any code that can be defined by a graph, e.g., tornado codes and structured irregular repeat-accumulate (IRA) codes, since graph-defined codes suffer from trapping sets.

The present invention is also not limited to receiving and processing log-likelihood ratios. Various embodiments of the present invention may be envisioned in which other soft values, such as likelihood ratios, or hard values such as hard decision bits are processed.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

We claim:

1. An apparatus comprising an error-correction decoder for recovering an error-correction-encoded codeword, the error-correction decoder comprising a check-node unit configured to:

(a) receive a set of current input values, wherein:
the set of current input values corresponds to the error-correction-encoded codeword; and
each current input value in the set corresponds to a different bit of the error-correction-encoded codeword;

(b) generate a set of current check-node messages based on the set of current input values; and (c) generate a set of average check-node messages based on the set of current check-node messages and at least one set of previous check-node messages, wherein:

each average check-node message is generated by averaging a current check-node message and a corresponding previous check-node message for each set of the at least one set of previous check-node messages.

2. The apparatus of claim 1, wherein the set of current check-node messages is generated by applying a min-sum algorithm with a value-reuse technique to the set of current input values.

3. The apparatus of claim 2, wherein the check-node unit comprises: a partial-state processor configured to identify a smallest magnitude value and a second-smallest magnitude value for the set of current input values; and a check-node message selector configured to generate the set of current check-node messages based on the smallest and second smallest magnitude values.

4. The apparatus of claim 3, wherein the check-node unit further comprises:

final-state memory configured to store a smallest magnitude value and a second-smallest magnitude value for each set of the at least one set of previous check-node messages; and at least one check-node message selector configured to generate the at least one set of previous check-node messages based on the stored smallest magnitude value and the stored second-smallest magnitude value corresponding to the at least one set of previous check-node messages.

5. The apparatus of claim 4, wherein the check-node unit further comprises:

an adder configured to add each current check-node message and at least one corresponding previous check-node message to generate a sum; and a divider configured to divide the sum by a count of the current check-node message and the at least one corresponding previous check-node message to generate a corresponding average check-node message.

6. The apparatus of claim 1, wherein the check-node unit is selectively configurable to operate in (i) a first operating mode to output current check-node messages and (ii) a second operating mode to output average check-node messages; and the decoder further comprises a controller configured to switch between the first operating mode and the second operating mode.

7. The apparatus of claim 6, wherein the controller is configured to:

(i) operate the check-node unit in the first operating mode to output the current check-node messages; and (ii) switch the check-node unit to the second operating mode to output the average check-node messages, if the error-correction decoder fails to recover the error-correction-encoded codeword within a specified number of iterations in the first operating mode.

8. The apparatus of claim 6, wherein the controller is configured to:

(i) operate the check-node unit in the first operating mode to output the current check-node messages;

(ii) determine a number of unsatisfied check nodes, if the error-correction decoder fails to recover the error-correction-encoded codeword within a specified number of iterations in the first operating mode;

(iii) compare the number of unsatisfied check nodes to a specified threshold value; and (iv) selectively switch, based on the comparison, the check-node unit to the second operating mode to output the average check-node messages.

9. The apparatus of claim 8, wherein the controller switches the check-node unit to the second operating mode if the comparison determines that the number of unsatisfied check nodes is less than the specified threshold value.

10. The apparatus of claim 1, wherein the error-correction decoder is a layered decoder having multiple decoder layers, wherein the check-node unit is configured to concurrently generate two different sets of average check-node messages for two different decoder layers.

11. The apparatus of claim 1, wherein the error-correction decoder is an LDPC decoder.

12. The apparatus of claim 1, wherein:

the error-correction decoder further comprises one or more other check-node units and a plurality of variable-node units, wherein the check-node units and variable-node units are configured to perform a message-passing algorithm;

the set of current input values is a set of current variable-node messages generated by the variable-node units;

the check-node units are configured to generate average check-node messages for transmission to the variable-node units; and each average check-node message is generated by averaging (i) a current check-node message based on the set of current variable-node messages and (ii) at least one previous check-node message based on at least one set of previous variable-node messages.

13. A method for recovering an error-correction-encoded codeword, the method comprising:

(a) receiving a set of current input values, wherein:

the set of current input values corresponds to the error-correction-encoded codeword; and each current input value in the set corresponds to a different bit of the error-correction-encoded codeword;

(b) generating a set of current check-node messages based on the set of current input values; and (c) generating a set of average check-node messages based on the set of current check-node messages and at least one set of previous check-node messages, wherein:

each average check-node message is generated by averaging a current check-node message and a corresponding previous check-node message for each set of the at least one set of previous check-node messages.

14. The method of claim 13, wherein step (b) comprises:

(b1) identifying a smallest magnitude value and a second-smallest magnitude value for the set of current input values; and (b2) generating the set of current check-node messages based on the smallest and second smallest magnitude values.

15. The method of claim 14, wherein step (c) comprises:

(c1) storing a smallest magnitude value and a second-smallest magnitude value for each set of the at least one set of previous check-node messages; and (c2) generating the at least one set of previous check-node messages based on the stored smallest magnitude value and the stored second-smallest magnitude value corresponding to the at least one set of previous check-node messages.

16. The method of claim 15, wherein step (c) further comprises:
- (c3) adding each current check-node message and at least one corresponding previous check-node message to generate a sum; and
- (c4) dividing the sum by a count of the current check-node message and the at least one corresponding previous check-node message to generate a corresponding average check-node message.

17. The method of claim 13, wherein the method further comprises, prior to steps (a)-(c):
- (1) receiving a set of prior input values, wherein:
    the set of prior input values corresponds to the error-correction-encoded codeword; and
    each prior input value in the set corresponds to a different bit of the error-correction-encoded codeword;
- (2) generating a set of prior check-node messages based on the set of prior input values;
- (3) generating a set of output values based on the set of prior check-node messages, wherein: the set of output values corresponds to the error-correction-encoded codeword; and each output value in the set corresponds to a different bit of the error-correction-encoded codeword;
- (4) determining whether the error-correction-encoded codeword has been correctly recovered based on the set of output values;
- (5) if step (4) determines that the error-correction-encoded codeword has not been correctly recovered, then determining whether a specified number of iterations of steps (1)-(4) have been performed; and
- (6) if step (5) determines that the specified number of iterations of steps (1)-(4) have not been performed, then repeating at least steps (1)-(4), wherein:
  steps (a)-(c) are performed, if step (5) determines that the specified number of iterations of steps (1)-(4) have been performed.

18. The method of claim 13, wherein the error-correction-encoded codeword is a low-density parity-check encoded codeword.

19. An apparatus comprising an error-correction decoder for recovering an error-correction-encoded codeword, the error-correction decoder comprising check-node units and variable-node units configured to perform a message-passing algorithm, wherein:
- the CNUs are configured to generate average check-node messages for transmission to the variable-node units; and
- each average check-node message is generated by averaging (i) a current check-node message based on a set of current variable-node messages and (ii) at least one previous check-node message based on at least one set of previous variable-node messages, wherein at least one check-node unit comprises:
- a partial-state processor configured to generate a smallest magnitude and a second-smallest magnitude for the set of current variable-node messages;
- a check-node message selector configured to generate the current check-node message based on the smallest and second smallest magnitudes;
- final-state memory configured to store a smallest magnitude and a second-smallest magnitude for each set of the at least one set of previous variable-node messages;
- at least one check-node message selector configured to generate the at least one previous check-node message based on the stored smallest magnitude and the stored second-smallest magnitude corresponding to the at least one set of previous variable-node messages;
- an adder configured to add the current check-node message and the at least one previous check-node message to generate a sum; and
- a divider configured to divide the sum by a count of the current check-node message and the at least one previous check-node message to generate the average check-node message.

* * * * *

UNITED STATES PATENT AND TRADEMARK OFFICE
CERTIFICATE OF CORRECTION

| | | |
|---|---|---|
| PATENT NO. | : 8,607,115 B2 | Page 1 of 1 |
| APPLICATION NO. | : 12/475786 | |
| DATED | : December 10, 2013 | |
| INVENTOR(S) | : Kiran Gunnam et al. | |

It is certified that error appears in the above-identified patent and that said Letters Patent is hereby corrected as shown below:

- Item (56) References Cited in the Other Publications on title page 3, cancel the text beginning with "C.A. Cole, S.G. Wilson, etc.", and ending with "http://arxviv.org.abs/cs.IT/0605051", and replace with --C.A. Cole, S.G. Wilson, E.K. Hall and T.R. Giallorenzi, "A General Method for Finding Low Error Rates of LDPC Codes, http://arxiv.org.abs/cs.IT/0605051--.

- In the Foreign Patent Documents on title page 2, column 2, please replace "JP200910222" with --JP2009100222--.

Signed and Sealed this
Eighth Day of July, 2014

Michelle K. Lee
*Deputy Director of the United States Patent and Trademark Office*